United States Patent
Kawashima et al.

(10) Patent No.: US 12,205,992 B2
(45) Date of Patent: Jan. 21, 2025

(54) CRYSTALLINE OXIDE THIN FILM, MULTILAYER BODY AND THIN FILM TRANSISTOR

(71) Applicant: IDEMITSU KOSAN CO., LTD., Tokyo (JP)

(72) Inventors: Emi Kawashima, Sodegaura (JP); Kazuyoshi Inoue, Sodegaura (JP); Masashi Oyama, Sodegaura (JP); Masatoshi Shibata, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 529 days.

(21) Appl. No.: 17/598,817

(22) PCT Filed: Mar. 26, 2020

(86) PCT No.: PCT/JP2020/013566
§ 371 (c)(1),
(2) Date: Sep. 27, 2021

(87) PCT Pub. No.: WO2020/196716
PCT Pub. Date: Oct. 1, 2020

(65) Prior Publication Data
US 2022/0199784 A1   Jun. 23, 2022

(30) Foreign Application Priority Data
Mar. 28, 2019   (JP) ................................. 2019-064561

(51) Int. Cl.
*H01L 29/24*  (2006.01)
*H01L 21/02*  (2006.01)
(Continued)

(52) U.S. Cl.
CPC .............. *H01L 29/24* (2013.01); *H01L 29/04* (2013.01); *H01L 29/66969* (2013.01);
(Continued)

(58) Field of Classification Search
CPC ... H01L 29/24; H01L 29/04; H01L 29/66969; H01L 29/7869; H01L 21/02565; H01L 21/02631; H01L 21/02667
See application file for complete search history.

(56) References Cited

U.S. PATENT DOCUMENTS

2002/0164475 A1   11/2002  Imamura et al.
2005/0094381 A1   5/2005   Imamura et al.
(Continued)

FOREIGN PATENT DOCUMENTS

| CN | 1356292 A   | 7/2002 |
|---|---|---|
| CN | 102160182 A | 8/2011 |

(Continued)

OTHER PUBLICATIONS

International Searching Authority, "International Search Report," issued in connection with International Patent Application No. PCT/JP2020/013566, dated Jun. 9, 2020.
(Continued)

*Primary Examiner* — Mary A Wilczewski
*Assistant Examiner* — Nathan Pridemore
(74) *Attorney, Agent, or Firm* — Foley & Lardner LLP

(57) ABSTRACT

A crystalline oxide thin film contains an In element, a Ga element and an Ln element, in which the In element is a main component, the Ln element is at least one element selected from the group consisting of La, Nd, Sm, Eu, Gd, Tb, Dy, Ho, Er, Tm, Yb, and Lu, and an average crystal grain size $D_1$ is in a range from 0.05 μm to 0.5 μm.

20 Claims, 37 Drawing Sheets

(51) Int. Cl.
   *H01L 29/04* (2006.01)
   *H01L 29/66* (2006.01)
   *H01L 29/786* (2006.01)

(52) U.S. Cl.
   CPC .... *H01L 29/7869* (2013.01); *H01L 21/02565* (2013.01); *H01L 21/02631* (2013.01); *H01L 21/02667* (2013.01)

(56) References Cited

U.S. PATENT DOCUMENTS

| | | | |
|---|---|---|---|
| 2010/0065835 A1* | 3/2010 | Inoue | H01L 29/7869 257/E29.094 |
| 2011/0198586 A1 | 8/2011 | Inoue et al. | |
| 2013/0234134 A1 | 9/2013 | Inoue et al. | |
| 2014/0124776 A1 | 5/2014 | Takahashi et al. | |
| 2015/0270405 A1 | 9/2015 | Takahashi et al. | |
| 2015/0294994 A1 | 10/2015 | Takahashi et al. | |
| 2015/0332902 A1 | 11/2015 | Ebata | |
| 2016/0343554 A1* | 11/2016 | Tomai | H01J 37/3426 |
| 2018/0151596 A1 | 5/2018 | Takahashi et al. | |
| 2018/0219098 A1 | 8/2018 | Inoue et al. | |
| 2018/0323220 A1 | 11/2018 | Takahashi et al. | |
| 2019/0177176 A1 | 6/2019 | Inoue et al. | |
| 2021/0225887 A1 | 7/2021 | Takahashi et al. | |

FOREIGN PATENT DOCUMENTS

| | | | |
|---|---|---|---|
| CN | 102187467 A | 9/2011 | |
| CN | 105734493 A | 7/2016 | |
| CN | 108085644 A | 5/2018 | |
| JP | 5373212 B2 | 12/2013 | |
| JP | 2016-201458 A | 12/2016 | |
| JP | 6097458 B1 | 3/2017 | |
| JP | 6289693 B2 | 3/2018 | |
| JP | 6334598 B2 | 5/2018 | |
| JP | 2018-107316 A | 7/2018 | |
| TW | 201841865 A | 12/2018 | |
| WO | WO-2012/090490 A1 | 7/2012 | |
| WO | WO-2017/017966 A1 | 2/2017 | |
| WO | WO-2018/043323 A1 | 3/2018 | |
| WO | WO-2018/143073 A1 | 8/2018 | |

OTHER PUBLICATIONS

International Searching Authority, "Written Opinion," issued in connection with International Patent Application No. PCT/JP2020/013566, dated Jun. 9, 2020.

Chinese Office Action, dated Apr. 26, 2022, issued in corresponding Chinese Application No. 202080023273.1.

International Searching Authority, "International Preliminary Report on Patentability," issued in connection with International Patent Application No. PCT/JP2020/013566, dated Oct. 7, 2021 (10 pages).

Taiwan Office Action issued in connection with TW Appl. Ser. No. 109110506 dated May 27, 2022 without English translation (3 pages).

* cited by examiner

FIG. 11
EXAMPLE 1
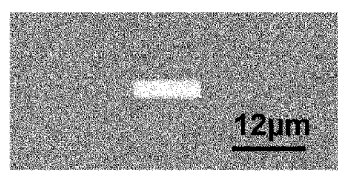
COMPARATIVE 1
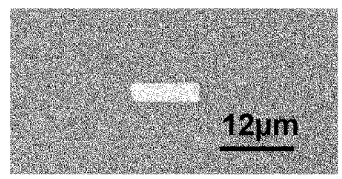
EXAMPLE 2
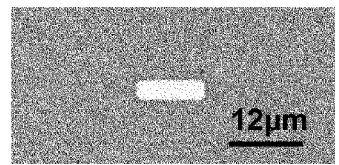
COMPARATIVE 3
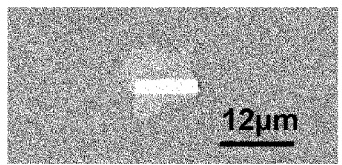
EXAMPLE 3
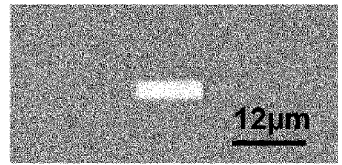
COMPARATIVE 4
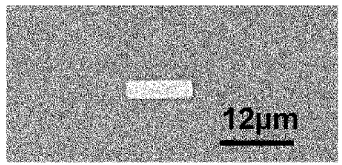

FIG.12
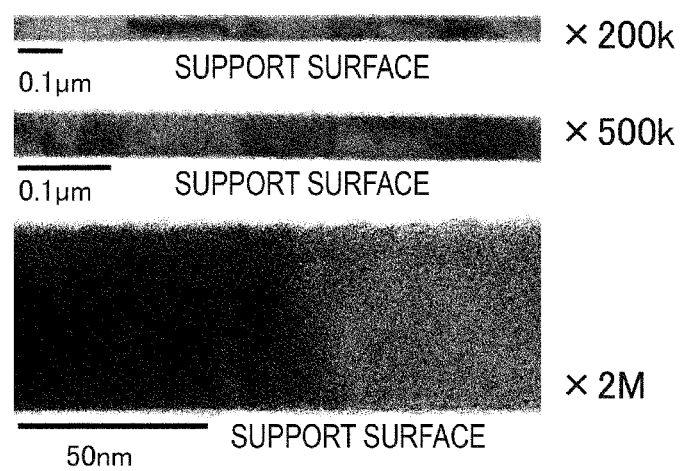
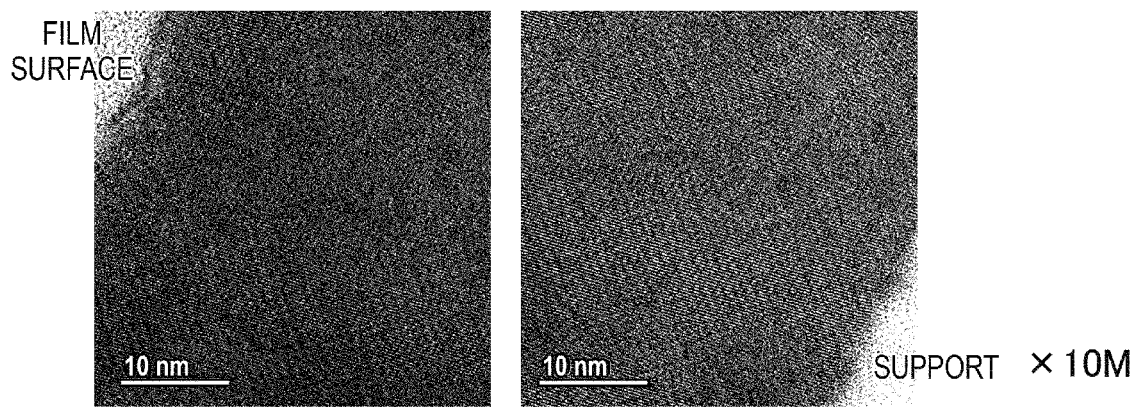

FIG. 13
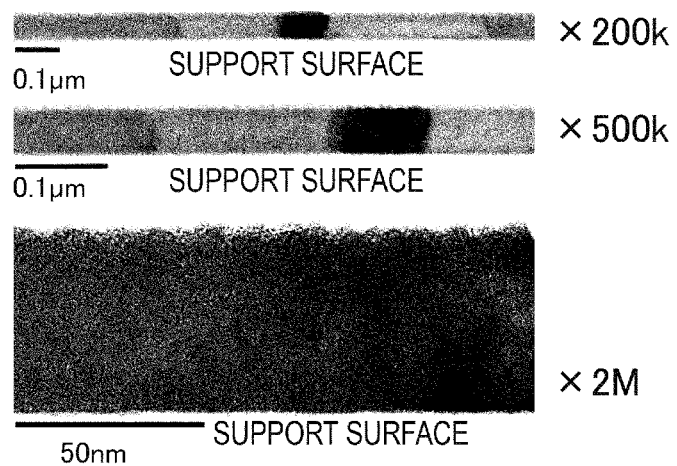
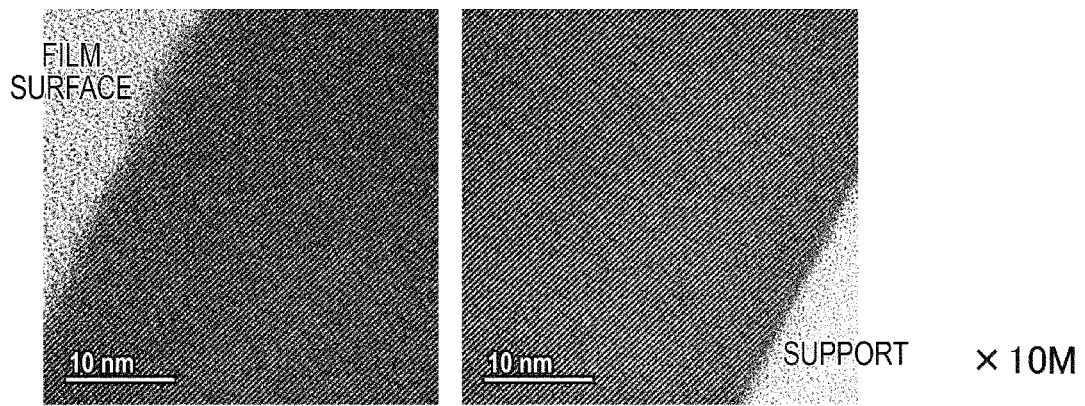

FIG.14
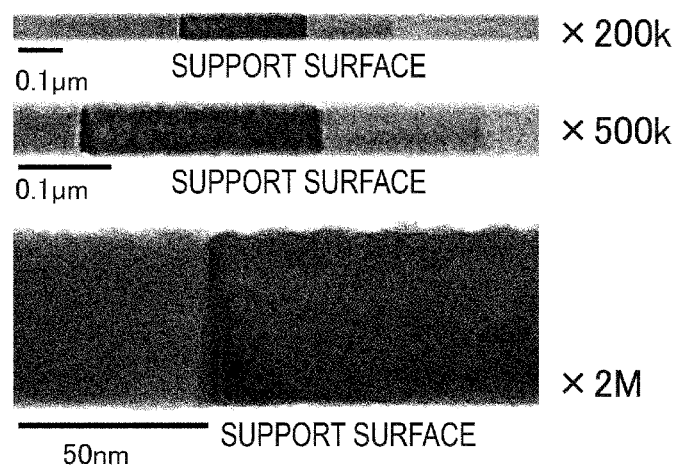
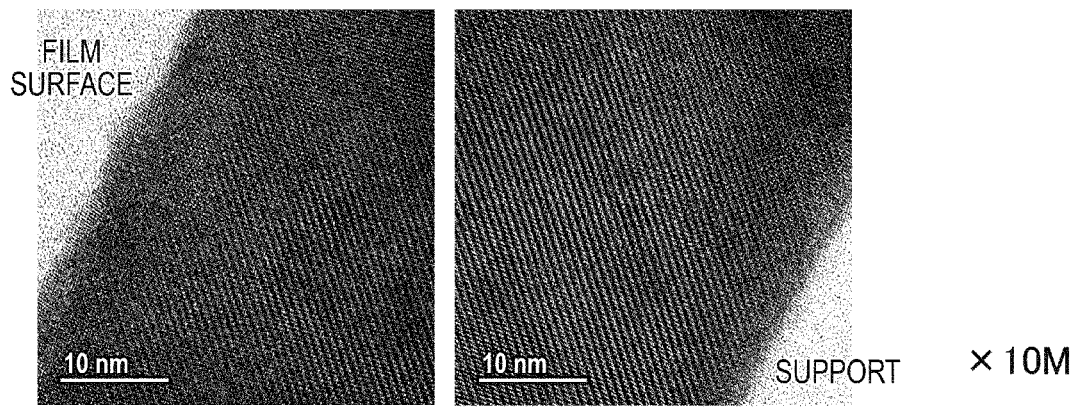

FIG.15
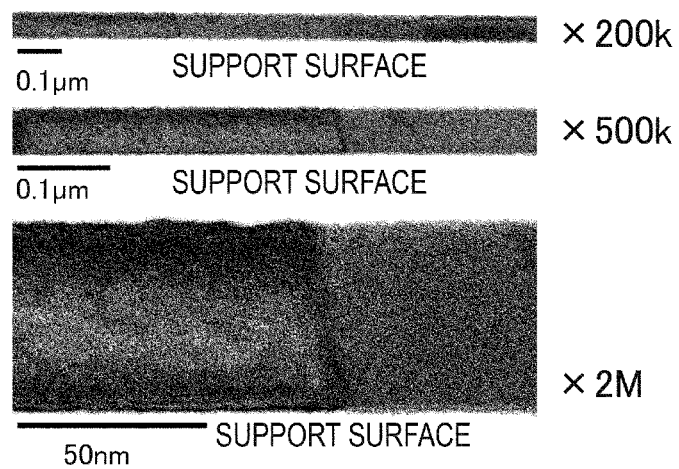
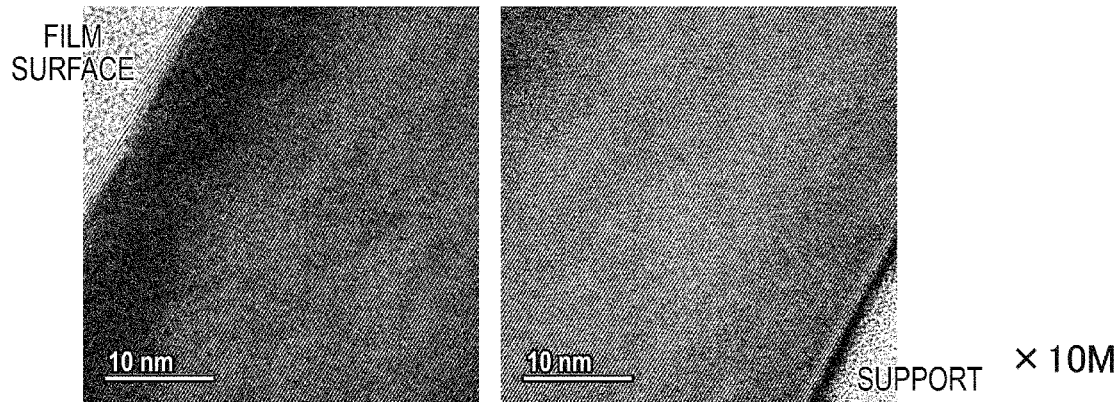

FIG.16
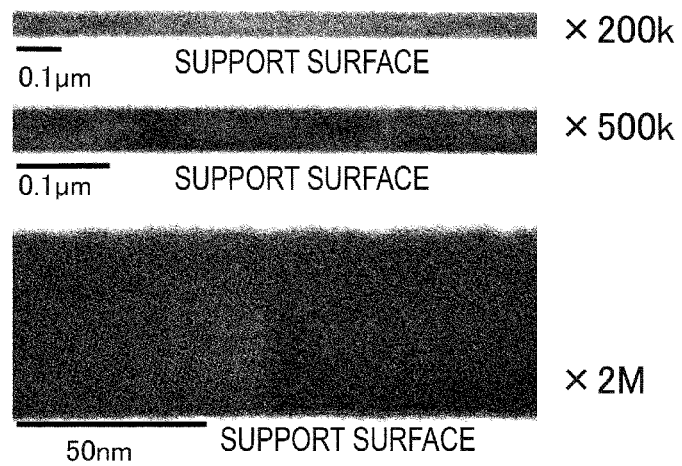
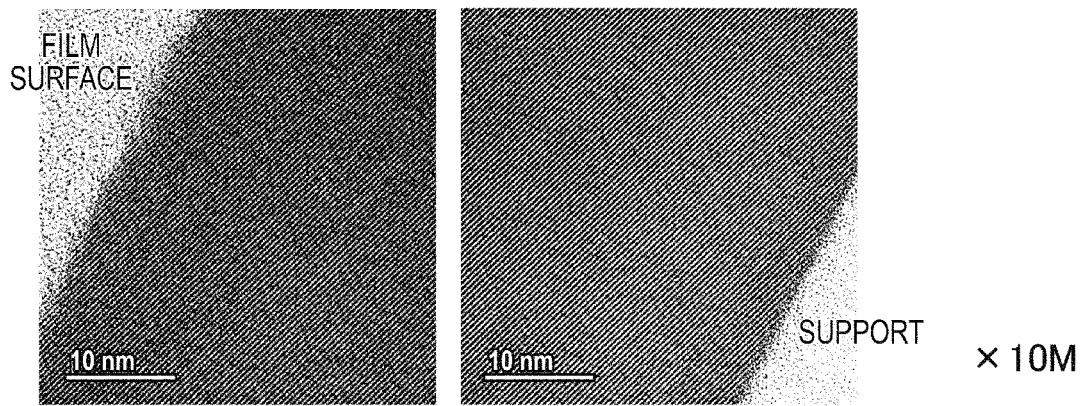

FIG.17
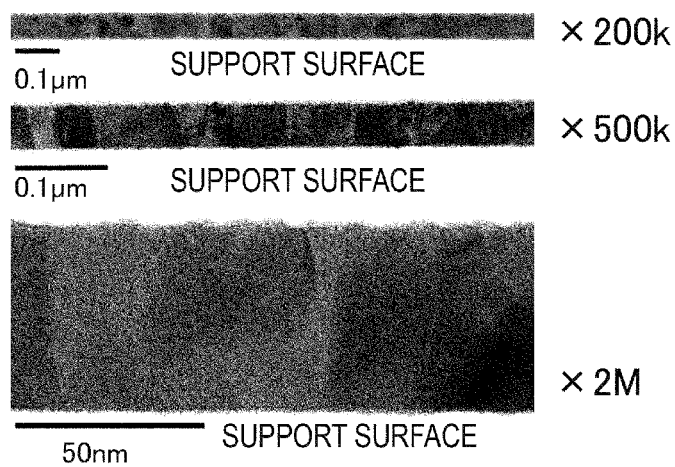
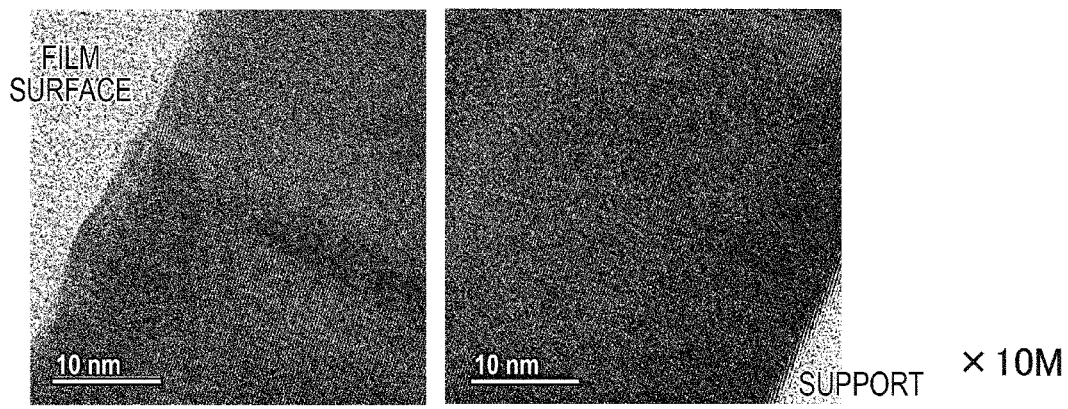

FIG. 18
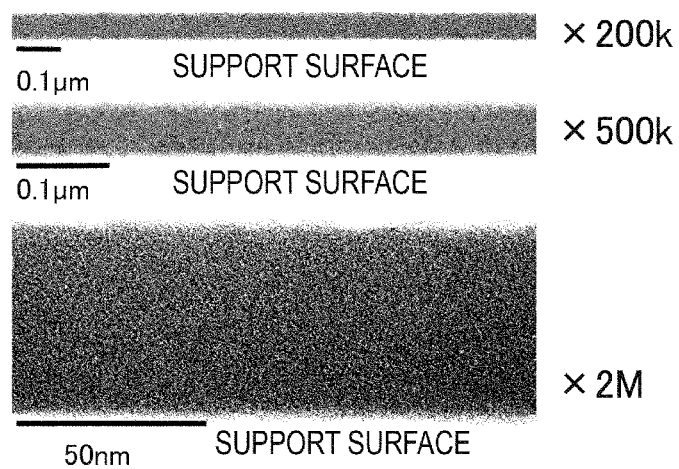
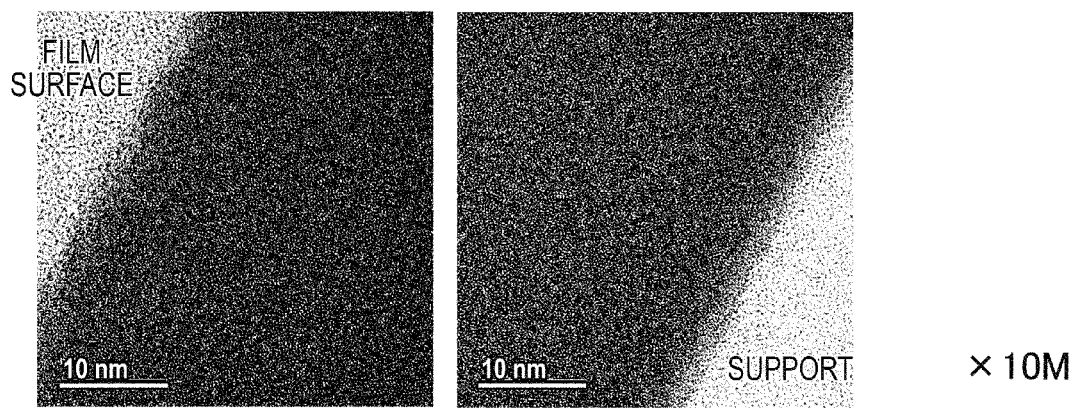

×200k

×200k

× 200k

×200k

×200k

×200k

× 500k

FIG.26
PLANE TEM IMAGE
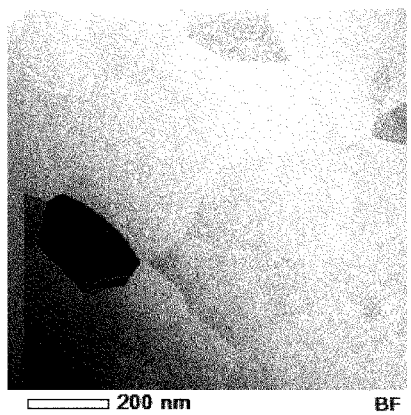
EDS(Sm)
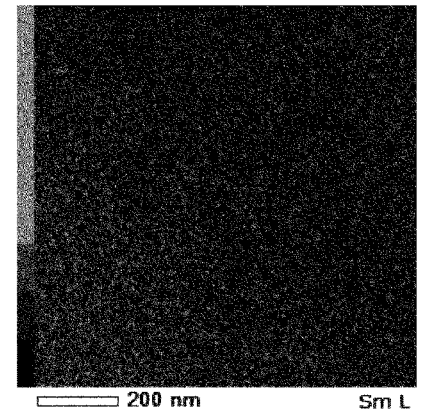
EDS(In)
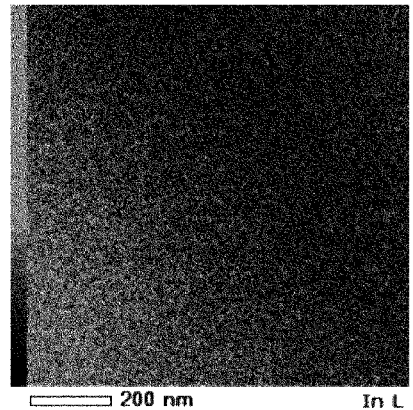
EDS(Ga)
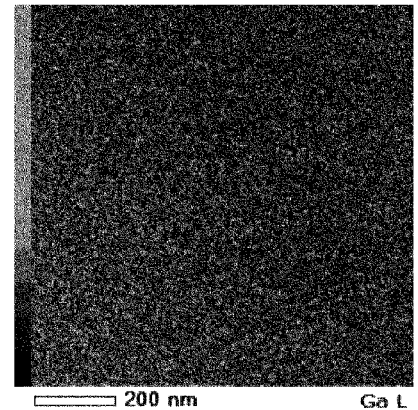

FIG.27
PLANE TEM IMAGE
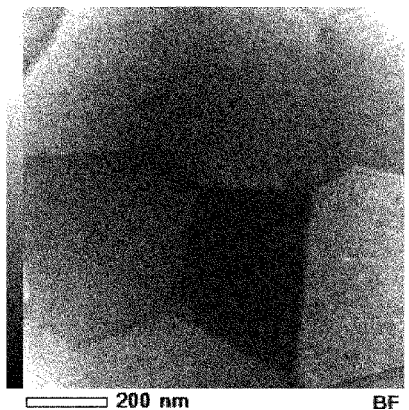
EDS(Sm)
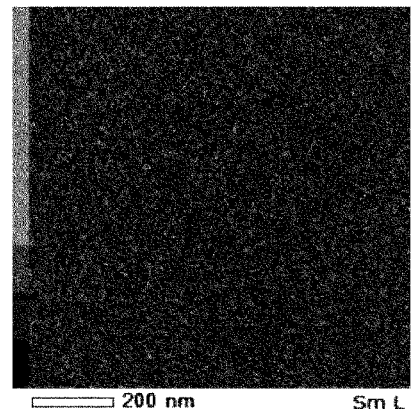
EDS(In)
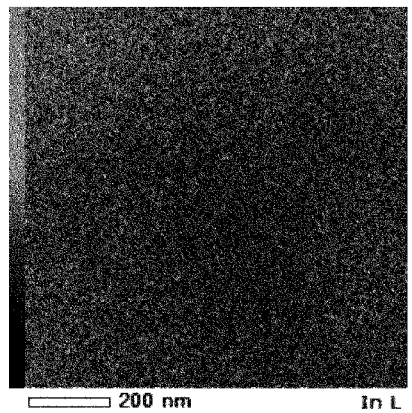
EDS(Ga)
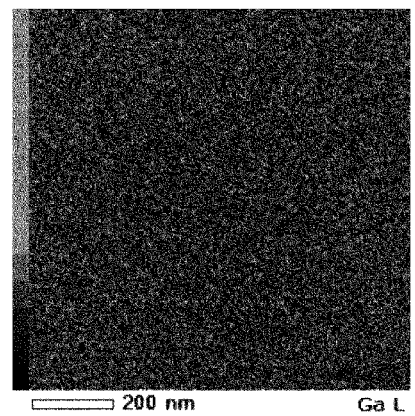

FIG.28
PLANE TEM IMAGE
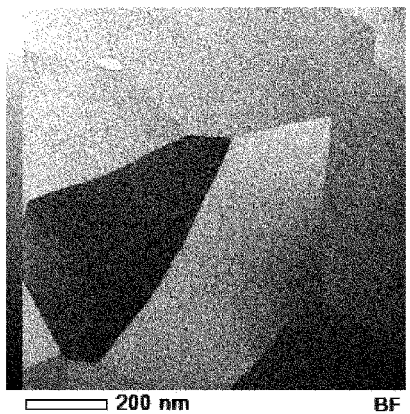
200 nm    BF
EDS(Sm)
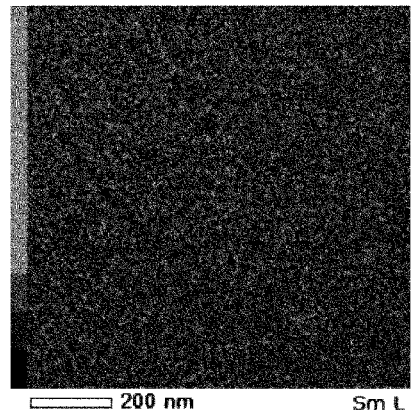
200 nm    Sm L
EDS(In)
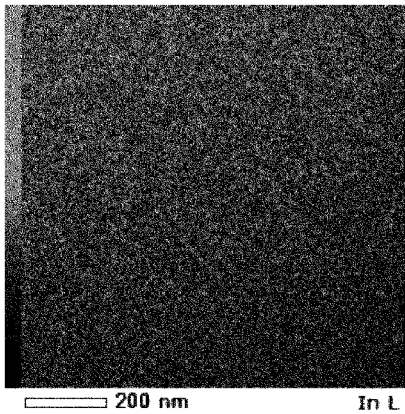
200 nm    In L
EDS(Ga)
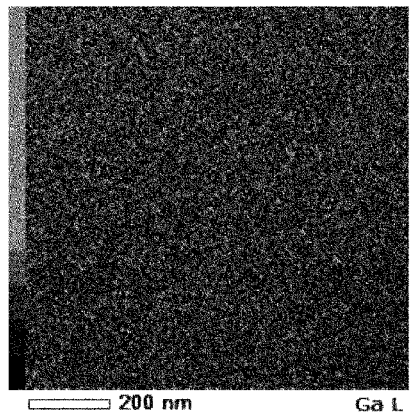
200 nm    Ga L FIG. 29
PLANE TEM IMAGE
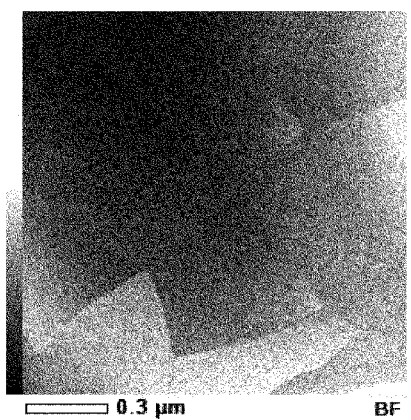
EDS(Sm)
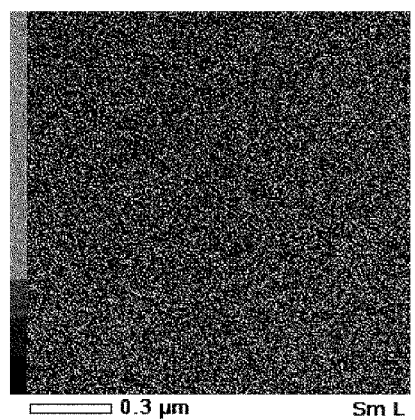
EDS(In)
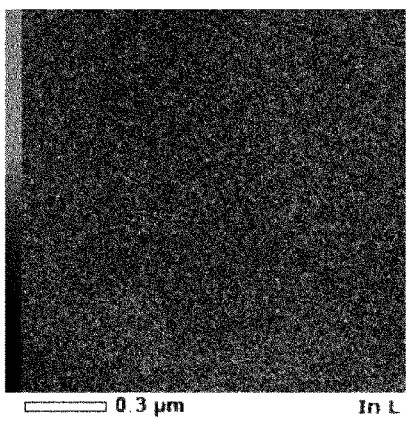
EDS(Ga)
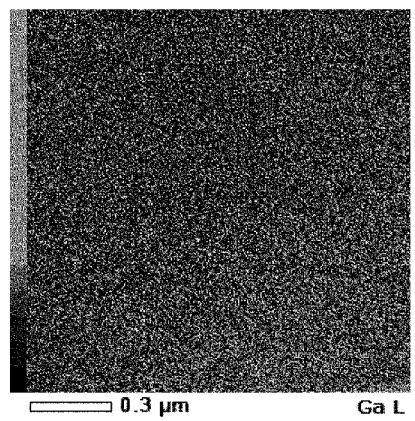

FIG.30
PLANE TEM IMAGE
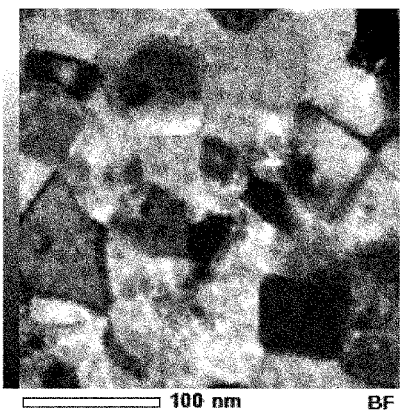
EDS(In)
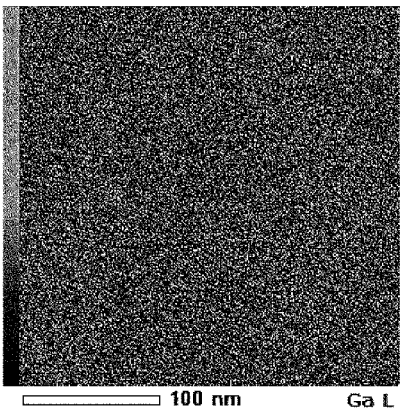
EDS(Ga)
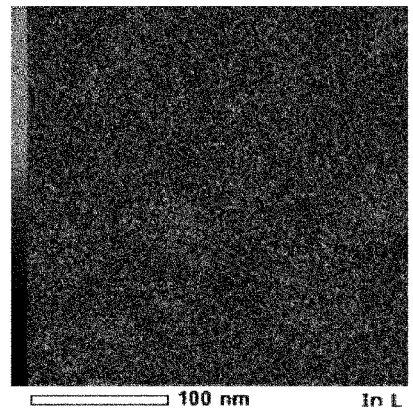

CRYSTALLINE OXIDE THIN FILM, MULTILAYER BODY AND THIN FILM TRANSISTOR

CROSS-REFERENCE TO RELATED APPLICATIONS

The present application claims priority under 37 U.S.C. § 371 to International Patent Application No. PCT/JP2020/013566, filed Mar. 26, 2020, which claims priority to and the benefit of Japanese Patent Application No. 2019-064561, filed on Mar. 28, 2019. The contents of these applications are hereby incorporated by reference in their entireties.

TECHNICAL FIELD

The present invention relates to a crystalline oxide thin film, a laminate, and a thin film transistor.

BACKGROUND ART

A problem of an amorphous oxide semiconductor is that electron carriers are not stable due to oxygen deficiency.

To address this problem, in Patent Literatures 1 and 2, a film is formed using a crystalline oxide semiconductor material whose composition mainly includes In (indium) and Ga (gallium) in a sputtering gas added with water ($H_2O$), which enables the crystalline oxide semiconductor material to be used for a channel, thereby producing a stable thin film transistor (TFT) with a high mobility.

In the film formation in the sputtering gas added with water, a problem of a processing device is a corrosion of pipes and a problem of TFT characteristics is an in-plane fluctuation of a threshold voltage Vth and a deterioration in reliability due to an influence of a hydrogen atom.

To address these problems, Patent Literatures 3, 4, and 5 disclose that a composition including Ln (lanthanoid) in addition to In—Ga—O is used to produce a stable TFT having a high mobility even if the film contains oxygen ($O_2$).

Patent Literature 6 discloses characteristics of TFT. The TFT of Patent Literature 6 has an oxide thin-film formed using a sputtering target containing an oxide sintered body containing indium, gallium, and samarium.

CITATION LIST

Patent Literature(s)

Patent Literature 1: JP Patent No. 5373212
Patent Literature 2: JP 2018-107316 A
Patent Literature 3: JP Patent No. 6097458
Patent Literature 4: JP Patent No. 6334598
Patent Literature 5: JP Patent No. 6289693
Patent Literature 6: International Publication No. WO2018/043323

SUMMARY OF THE INVENTION

Problem(s) to be Solved by the Invention

In recent years, a TFT device tends to become compact, whereby characteristics of a compact TFT have been important. The compact TFT here refers to a TFT having a channel length L of 50 μm or less.

Application of the oxide thin-film described in Patent Literatures 1 to 3 and 5 and an oxide thin-film partially described in Patent Literature 4 to the compact TFT deteriorates trap limiting conductivity region characteristics. The trap limiting conductivity region characteristics are defined as a mobility to which trap limiting conductivity, which is a main conductivity of an oxide semiconductor, contributes in a voltage region where a gate applied voltage Vg is low. When the TFT is downsized, the trap limiting conductivity region characteristics tend to be deteriorated.

Patent Literature 6 describes a TFT having a channel length L exceeding 50 μm, in which electrodes are patterned with a metal mask. In the TFT described in Patent Literature 6, favorable TFT characteristics are obtained, but the trap limiting conductivity region characteristics in a compact TFT are not obtained.

An object of the invention is to provide a crystalline oxide thin film exhibiting a favorable mobility even in a compact TFT, a laminate having the crystalline oxide thin film, and a thin film transistor having the crystalline oxide thin film.

Means for Solving the Problems

[1] A crystalline oxide thin film contains an In element, a Ga element and an Ln element, in which the In element is a main component, the Ln element is at least one element selected from the group consisting of La, Nd, Sm, Eu, Gd, Tb, Dy, Ho, Er, Tm, Yb, and Lu, and an average crystal grain size $D_1$ is in a range from 0.05 μm to 0.5 μm.

[2] In the crystalline oxide thin film according to [1], an average grain-boundary angle θ formed between a thin film surface of the crystalline oxide thin film and crystal grain boundaries inside the crystalline oxide thin film is in a range from 70 degrees to 110 degrees.

[3] In the crystalline oxide thin film according to [1] or [2], an average interval $D_2$ between crystal grain boundaries inside the crystalline oxide thin film is in a range from 0.05 μm to 0.40 μm.

[4] In the crystalline oxide thin film according to any one of [1] to [3], in a plane TEM-EDS analysis on the crystalline oxide thin film, metal elements forming the crystalline oxide thin film are not segregated in the crystal grain boundaries inside the crystalline oxide thin film.

[5] In the crystalline oxide thin film according to any one of [1] to [4], ranges of atomic composition ratios represented by formulae (1), (2) and (3) are satisfied, $$0.85 < In/(In+Ga+Ln) \leq 0.98 \quad (1)$$

$$0.01 \leq Ga/(In+Ga+Ln) < 0.11 \quad (2)$$

$$0.01 \leq Ln/(In+Ga+Ln) < 0.04 \quad (3).$$

[6] In the crystalline oxide thin film according to any one of [1] to [5], the crystalline oxide thin film includes crystal grains with a Bixbyite structure in electron beam diffraction of the crystalline oxide thin film.

[7] In the crystalline oxide thin film according to any one of [1] to [6], the Ln element is a Sm element.

[8] A laminate includes: the crystalline oxide thin film according to any one of [1] to [7]; and a support supporting the crystalline oxide thin film, in which an average grain-boundary angle θsub formed between a surface of the support and crystal grain boundaries inside the crystalline oxide thin film is in a range from 70 degrees to 110 degrees, and an average interval $D_2$ between the crystal grain boundaries inside the crystalline oxide thin film is in a range from 0.05 μm to 0.40 μm.

[9] A thin film transistor includes: electrodes; and a crystalline oxide thin film, in which in a cross-sectional TEM observation of the thin film transistor, a contact region length Ls between the electrode and the crystalline oxide thin film and an average interval $D_2$ between crystal grain boundaries inside the crystalline oxide thin film satisfy relationships of a formula (4) and a formula (5), $$1\ \mu m \leq Ls \leq 50\ \mu m \qquad (4)$$

$$10 \leq Ls/D_2 \leq 1000 \qquad (5).$$

[10] In the thin film transistor according to [9], the crystalline oxide thin film includes an In element, a Ga element, and an Ln element, in which the In element is a main component, the Ln element is at least one element selected from the group consisting of La, Nd, Sm, Eu, Gd, Tb, Dy, Ho, Er, Tm, Yb, and Lu, and an average crystal grain size $D_1$ in the crystalline oxide thin film is in a range from 0.05 μm to 0.5 μm.

[11] In the thin film transistor according to [9] or [10], an average grain-boundary angle θ formed between a thin film surface of the crystalline oxide thin film and the crystal grain boundaries inside the crystalline oxide thin film is in a range from 70 degrees to 110 degrees, and an average interval $D_2$ between the crystal grain boundaries inside the crystalline oxide thin film is in a range from 0.05 μm to 0.40 μm.

[12] A thin film transistor includes: a crystalline oxide thin film, in which the crystalline oxide thin film includes an In element, a Ga element, and an Ln element, the In element is a main component, the Ln element is at least one element selected from the group consisting of La, Nd, Sm, Eu, Gd, Tb, Dy, Ho, Er, Tm, Yb, and Lu, an average crystal grain size $D_1$ in the crystalline oxide thin film is in a range from 0.05 μm to 0.5 μm, an average grain-boundary angle θ formed between a thin film surface of the crystalline oxide thin film and crystal grain boundaries inside the crystalline oxide thin film is in a range from 70 degrees to 110 degrees, and an average interval $D_2$ between the crystal grain boundaries inside the crystalline oxide thin film is in a range from 0.05 μm to 0.40 μm.

[13] In the thin film transistor according to [12], in a plane TEM-EDS analysis on the crystalline oxide thin film, metal elements forming the crystalline oxide thin film are not segregated in the crystal grain boundaries inside the crystalline oxide thin film.

[14] In the thin film transistor according to [12] or [13], ranges of atomic composition ratios represented by formulae (1), (2) and (3) are satisfied, $$0.85 < In/(In+Ga+Ln) \leq 0.98 \qquad (1)$$

$$0.01 \leq Ga/(In+Ga+Ln) < 0.11 \qquad (2)$$

$$0.01 \leq Ln/(In+Ga+Ln) < 0.04 \qquad (3)$$

[15] In the thin film transistor according to any one of [12] to [14], the crystalline oxide thin film includes crystal grains with a Bixbyite structure in electron beam diffraction.

[16] In the thin film transistor according to any one of [12] to [15], the Ln element is a Sm element.

According to aspect of the invention, a crystalline oxide thin film exhibiting a favorable mobility even in a compact TFT, a laminate having the crystalline oxide thin film, and a thin film transistor having the crystalline oxide thin film can be provided.

BRIEF DESCRIPTION OF DRAWINGS

FIG. 11 shows a microscope image of a film state after semiconductor patterning in Examples and Comparatives.

FIG. 12 is a cross-sectional TEM image of an oxide thin-film in Example 1.

FIG. 13 is a cross-sectional TEM image of an oxide thin-film in Example 2.

FIG. 14 is a cross-sectional TEM image of an oxide thin-film in Example 3.

FIG. 15 is a cross-sectional TEM image of an oxide thin-film in Comparative 1.

FIG. 16 is a cross-sectional TEM image of an oxide thin-film in Comparative 2.

FIG. 17 is a cross-sectional TEM image of an oxide thin-film in Comparative 3.

FIG. 18 is a cross-sectional TEM image of an oxide thin-film in Comparative 4.

FIG. 26 is a plane TEM-EDS image of the oxide thin-film in Example 1.

FIG. 27 is a plane TEM-EDS image of the oxide thin-film in Example 3.

FIG. 28 is a plane TEM-EDS image of the oxide thin-film in Comparative 1.

FIG. 29 is a plane TEM-EDS image of the oxide thin-film in Comparative 2.

FIG. 30 is a plane TEM-EDS image of the oxide thin-film in Comparative 3.

DESCRIPTION OF EMBODIMENT(S)

Figure 1:
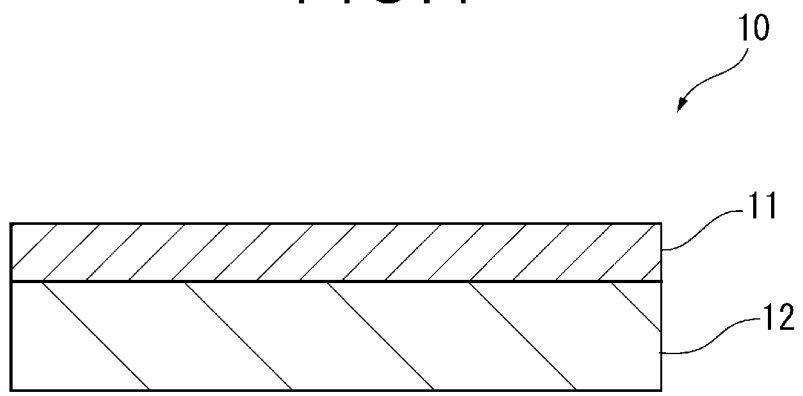
FIG. 1 shows a vertical cross section of a laminate according to an exemplary embodiment of the invention.

Exemplary embodiment(s) of the invention will be described below with reference to attached drawing(s). It should however be noted that it is easily understood by those skilled in the art that the exemplary embodiment(s) may be modified in various manners, as long as such modification and details are compatible with an object and the gist and scope of the invention. Accordingly, the scope of the invention should by no means be interpreted to be limited to the disclosure in the exemplary embodiment(s) below.

Further, in the drawing(s), a size, a layer thickness, and a region are sometimes exaggerated for clarification. Accordingly, the invention should by no means be limited to the size, the layer thickness, and the region shown in the drawing(s). It should be noted that the drawing(s) schematically shows an ideal example, and illustrated shape(s) and/or value(s) are not limited to those shown in the drawing(s).

Further, ordinals such as "first," "second," and "third," used in the specification are attached for avoiding confusion between components, and are not numerically limiting.

In the specification and the like, the term "film" or "thin-film" is sometimes interchangeable with the term "layer."

Further, in a sintered body and an oxide thin-film in the specification and the like, the term "compound" and the term "crystalline phase" are sometimes interchangeable.

Herein, the term "oxide sintered body" is sometimes simply referred to as a "sintered body."

Herein, the term "sputtering target" is sometimes simply referred to as a "target."

In the specification and the like, the term "electrically connected" encompasses a connection through "an object of some electric action." The "object of some electric action" is not limited to specific object as long as such an object allows communication of electric signals between connected components. Examples of the "object of some electric action" include an electrode, a line, a switching element such as a transistor, a resistor, an inductor, a capacitor, and devices having other function(s).

In the specification and the like, a source and a drain of a transistor are sometimes interchanged when, for instance, a transistor of different polarity is used or a direction of a current is changed during an operation of a circuit. Accordingly, the terms "source" and "drain" in the specification and the like are interchangeable.

Herein, numerical ranges represented by "x to y" represents a range whose lower limit is the value (x) recited before "to" and whose upper limit is the value (y) recited after "to."

The inventors have found that even a compact TFT obtains a favorable mobility by controlling an average crystal grain size to be small in a crystalline oxide thin film containing In (indium) element as a main component, Ga (gallium) element, and Ln (lanthanoid) element.

The inventors have found that even though a sputtering gas does not contain water, a crystalline oxide thin film in which an average crystal grain size is controlled to be small is obtained by, for instance, controlling composition percentages of the In element, Ga element, and Ln element in the crystalline oxide thin film to fall within a predetermined range or controlling conditions in a process of manufacturing the compact TFT to fall within a predetermined range.

The inventors have achieved the invention on a basis of these findings.

1. Crystalline Oxide Thin Film

The crystalline oxide thin film of the exemplary embodiment contains the In element (indium element), Ga element (gallium element), and Ln element (lanthanoid element).

In the crystalline oxide thin film of the exemplary embodiment, the In element is a main component and the Ln element is at least one element selected from the group consisting of La, Nd, Sm, Eu, Gd, Tb, Dy, Ho, Er, Tm, Yb, and Lu.

The crystalline oxide thin film of the exemplary embodiment may consist essentially of In element (indium element), Ga element (gallium element), Ln element (lanthanoid element), and O element (oxygen element). Herein, the term "essentially" means that the crystalline oxide thin film of the exemplary embodiment may contain other component(s) to the extent that the effects of the invention attributed to the combination of the In element (indium element), Ga element (gallium element), Ln element (lanthanoid element), and O element (oxygen element) are achieved.

Average Crystal Grain Size $D_1$

In the crystalline oxide thin film of the exemplary embodiment, an average crystal grain size $D_1$ is in a range from 0.05 μm to 0.5 μm, preferably in a range from 0.05 μm to 0.4 μm.

The average crystal grain size $D_1$ in the crystalline oxide thin film herein is measured based on a plane TEM observation image (sometimes referred to as a "plane TEM image"). Specifically, the average crystal grain size $D_1$ is calculated by analyzing diameters of crystal grains observed in a plane TEM observed at a magnification 200,000 times using a transmission electron microscope. As another measurement method of the average crystal grain size $D_1$, the same analysis can be performed by EBSP (backscattered electron diffraction image) of a sample after gallium ion beam irradiation and before plane TEM observation as described in Examples described later.

Angle Formed Between Thin Film Surface and Crystal Grain Boundaries in Thin Film In the crystalline oxide thin film of the exemplary embodiment, an average grain-boundary angle θ formed between a thin film surface and crystal grain boundaries in the thin film is preferably in a range from 70 degrees to 110 degrees.

When the average grain-boundary angle θ formed between the thin film surface and the crystal grain boundaries in the thin film is in a range from 70 degrees to 110 degrees, even in a compact TFT having a contact region length with an electrode, the crystal grain boundaries are not excessively inclined to a surface of the electrode but the crystal grain boundaries can be densely present in a length direction of the contact region length, so that the thin film transistor having the crystalline oxide thin film of the exemplary embodiment exhibits more favorable mobility.

The average grain-boundary angle θ formed between the thin film surface and the crystal grain boundaries in the thin film herein is measured based on a cross-sectional TEM observation image (sometimes referred to as a "cross-sectional TEM image"). Specifically, the average grain-boundary angle θ is calculated by analyzing angles, which are formed between the thin film surface and the crystal grain boundaries, observed in a cross-sectional TEM observed at a magnification 200,000 times using a transmission electron microscope.

Average Interval $D_2$ Between Crystal Grain Boundaries in Thin Film

In the crystalline oxide thin film of the exemplary embodiment, an average interval $D_2$ between the crystal grain boundaries in the thin film is preferably in a range from 0.05 μm to 0.40 μm, more preferably in a range from 0.08 μm to 0.30 μm.

The average interval $D_2$ between the crystal grain boundaries in the thin film herein is measured based on the cross-sectional TEM observation image. Specifically, the average interval $D_2$ is calculated, in an image observed at a magnification 200,000 times using a transmission electron microscope, by extracting any three fields of view so that observation points do not overlap in an L length direction in the thin film transistor with a size of 1 μm in a channel direction and an oxide film thickness of 50 nm, and analyzing intervals of crystal grains observed in the cross-sectional TEM image.

Segregation State at Crystal Grain Boundaries

In the plane TEM-EDS analysis on the crystalline oxide thin film of the exemplary embodiment, metal elements forming the crystalline oxide thin film are preferably not segregated in the crystal grain boundaries in the thin film. The phrase that "not segregated in the crystal grain boundaries in the thin film" means that metal elements are uniformly distributed to cause no unevenness also in the grain boundaries. No segregation of the metal elements forming the crystalline oxide thin film in the crystal grain boundaries improves trap limiting conductivity region characteristics.

Composition of Thin Film

The crystalline oxide thin film of the exemplary embodiment preferably satisfies a range defined by atomic composition ratios represented by formulae (1), (2) and (3).

$$0.85 < \text{In}/(\text{In}+\text{Ga}+\text{Ln}) \leq 0.98 \quad (1)$$

$$0.01 \leq \text{Ga}/(\text{In}+\text{Ga}+\text{Ln}) < 0.11 \quad (2)$$

$$0.01 \leq \text{Ln}/(\text{In}+\text{Ga}+\text{Ln}) < 0.04 \quad (3)$$

With In/(In+Ga+Ln) exceeding 0.85 in the crystalline oxide thin film of the exemplary embodiment, when a compact TFT is driven, electrons that are carriers are less likely to be affected by an energy potential barrier due to defects in the oxide thin film, and as a result, a compact TFT with excellent trap limiting conductivity region characteristics can be obtained.

With In/(In+Ga+Ln) being 0.98 or less in the crystalline oxide thin film of the exemplary embodiment, leakage current is unlikely to occur when a negative gate voltage is applied to a compact TFT, and transistor characteristics with excellent ON/OFF can be obtained.

In/(In+Ga+Ln) is preferably more than 0.86 and 0.98 or less. In/(In+Ga+Ln) is further preferably more than 0.87 and 0.98 or less.

With Ga/(In+Ga+Ln) being 0.01 or more in the crystalline oxide thin film of the exemplary embodiment, the crystal grain size can be controlled to be small.

With Ga/(In+Ga+Ln) being less than 0.11 in the crystalline oxide thin film of the exemplary embodiment, when a compact TFT is driven, electrons that are carriers are less likely to be affected by a potential barrier formed by Ln (e.g., Sm) in the oxide thin film, and as a result, a compact TFT with excellent trap limiting conductivity region characteristics can be obtained.

Ga/(In+Ga+Ln) is preferably 0.01 or more and less than 0.11, further preferably 0.03 or more and less than 0.10.

With Ln/(In+Ga+Ln) being 0.01 or more in the crystalline oxide thin film of the exemplary embodiment, after annealing the oxide thin film, columnar crystals are formed in a direction perpendicular to the support, and as a result, a compact TFT with excellent trap limiting conductivity region characteristics can be obtained.

With Ln/(In+Ga+Ln) being less than 0.04 in the crystalline oxide thin film of the exemplary embodiment, when a compact TFT is driven, electrons that are carriers are less likely to be affected by a potential barrier formed by Ln (e.g., Sm) in the oxide thin film, and as a result, a compact TFT with excellent trap limiting conductivity region characteristics can be obtained.

Ln/(In+Ga+Ln) is preferably 0.01 or more and less than 0.04, further preferably 0.02 or more and less than 0.04.

Since the Ln element used in the crystalline oxide thin film of the exemplary embodiment has the outermost shell electron in the 6s orbital, it is generally known that compounds containing the Ln element have similar electrical properties. Accordingly, the Ln element is preferably Sm element (samarium element), though not particularly limited thereto. Compared with other Ln elements, the Sm element can form columnar crystals extending in the direction perpendicular to the support even if the content in the crystal oxide thin film is small. It is also considered that, with having an ionic radius about the same as that of the samarium element, the elements of the Ln element other than the samarium element produce the same effect as the crystalline oxide thin film containing the samarium element as the Ln element.

When the Ln element is the Sm element (samarium element), the crystalline oxide thin film of the exemplary embodiment preferably satisfies a range defined by atomic composition ratios represented by formulae (1A), (2A) and (3A).

$$0.85 < \text{In}/(\text{In}+\text{Ga}+\text{Sm}) \leq 0.98 \quad (1A)$$

$$0.01 \leq \text{Ga}/(\text{In}+\text{Ga}+\text{Sm}) < 0.11 \quad (2A)$$

$$0.01 \leq \text{Sm}/(\text{In}+\text{Ga}+\text{Sm}) < 0.04 \quad (3A)$$

The phrase that "In element is a main component" or "indium element is a main component" herein means that 50 at % or more of the total number of atoms of metal elements forming the crystalline oxide thin film or a sputtering target described later is the indium element. In the total number of the atoms of the metal elements forming the crystalline oxide thin film, the indium element preferably accounts for 70 at % or more, more preferably 80 at % or more, further preferably 85 at % or more. In the total number of the atoms of the metal elements forming the crystalline oxide thin film, with the indium element accounting for 50 at % or more, a TFT using the crystalline oxide thin film of the exemplary embodiment can exhibit a sufficiently high saturation mobility.

The contents (atomic ratio) of metal elements in the crystalline oxide thin film can be determined by measuring the abundance of each metal element by ICP (Inductive Coupled Plasma) measurement or XRF (X-ray Fluorescence) measurement. An inductively coupled plasma emission spectrometer can be used for the ICP measurement. A thin film X-ray fluorescence analyzer can be used for the XRF measurement.

The contents (atomic ratio) of the metal elements in the crystal oxide thin film in the compact TFT device can be analyzed with an error accuracy of 2 atomic % or less by TEM-EDS measurement using an electron microscope, ICP measurement using an inductively coupled plasma emission spectrometer, and SIMS analysis using a sector-type dynamic secondary ion mass spectrometer. First, the cross-sectional TEM-EDS is used to identify the metal elements in the crystalline oxide thin film, and a semi-quantitative analysis is used to identify the composition percentages within an error range of about 10 atomic %. Next, a standard oxide thin film is prepared having an atomic ratio of metal elements defined by 10 known kinds of composition percentages of metal elements in the range of 20 atomic % from the semi-quantitative analysis results. For the standard oxide thin film, a value measured by an inductively coupled plasma emission spectrometer or a thin film fluorescent X-ray analyzer is used as an absolute value of the composition percentage. Further, source and drain electrodes formed of the same material and the same channel length as the TFT device are prepared on the upper surface of the standard oxide thin film, and are used as a standard material for analysis of an oxide semiconductor layer by a sector-type dynamic secondary ion mass spectrometer SIMS (IMS 7f-Auto manufactured by AMETEK) to obtain a mass spectrometric intensity of each metal element, thereby preparing a calibration line of a known concentration of each metal element and the mass spectrometric intensity. Next, the atomic ratios of the oxide thin film of the actual TFT device taken out from a panel are calculated from the spectral intensity by the SIMS analysis using a sector-type dynamic secondary ion mass spectrometer using the above-mentioned calibration line. The calculated atomic ratios can be confirmed separately with an accuracy of 2 atomic % or less of an atomic ratio of the oxide thin film measured by a thin film fluorescent X-ray analyzer or the inductively coupled plasma emission analyzer.

The crystalline oxide thin film of the exemplary embodiment preferably contains crystal grains having a Bixbyite structure. It can be confirmed by electron diffraction that the crystalline oxide thin film contains crystal grains having a Bixbyite structure.

When the crystal oxide thin film contains crystal grains with a Bixbyite structure, the crystal grains with a Bixbyite structure have a cubic crystal shape with favorable symmetry, so that deterioration of the TFT characteristics (mobility) can be suppressed even across the grain boundaries.

In the crystalline oxide thin film of the exemplary embodiment, predetermined elements (In, Ga, Ln and O) are contained and the average crystal grain size $D_1$ is controlled to a range from 0.05 μm to 0.5 μm. Accordingly, the compact TFT having the crystalline oxide thin film of the exemplary embodiment exhibits a favorable trap limiting conductivity region characteristics to allow for a large flow of current even at a low voltage. As a result, in a display installed in the compact TFT, an aperture ratio is increasable and a power consumption is reducible.

The crystalline oxide thin film according to the exemplary embodiment is useful as a compact TFT usable in a display device and the like such as a liquid crystal display and an organic EL display.

2. Production Method of Crystalline Oxide Thin Film

The crystalline oxide thin film according to the exemplary embodiment can be formed by using, for example, a sputtering target containing an oxide sintered body containing an In element, a Ga element and an Ln element. This sputtering target is sometimes referred to as a sputtering target according to the exemplary embodiment. The oxide sintered body contained in the sputtering target according to the exemplary embodiment is sometimes referred to as an oxide sintered body according to the exemplary embodiment.

In the oxide sintered body of the exemplary embodiment, the Ln element is at least one element selected from the group consisting of La, Nd, Sm, Eu, Gd, Tb, Dy, Ho, Er, Tm, Yb, and Lu.

In the oxide sintered body crystalline oxide thin film of the exemplary embodiment, the In element is preferably a main component.

Examples of the method of producing the crystalline oxide thin film according to the exemplary embodiment include a production method including forming an oxide thin film by sputtering using the sputtering target according to the exemplary embodiment. In the film forming by sputtering, one or more kinds of gases selected from the group consisting of argon and oxygen which do not substantially contain impurity gas are used as the sputtering gas. The "impurity" contained in the sputtering gas means an element that is not intentionally added and is a trace element that does not substantially affect the sputtering performance.

The atomic composition ratio of the oxide thin film obtained by the sputtering method reflects the atomic composition ratio of the oxide sintered body in the sputtering target. Therefore, it is preferable to form a film using the sputtering target containing the oxide sintered body having the atomic composition ratio same as that of the desired oxide thin film.

The target used in the sputtering method preferably contains an impurity metal of 500 ppm or less, and more preferably 100 ppm or less. In particular, at a content of tetravalent Sn in the target being 500 ppm or less, more preferably 100 ppm or less, even if Sn contained in the target remains as an impurity in the oxide film, Sn does not serve as an electron scattering source in the crystalline oxide semiconductor according to the exemplary embodiment to provide favorable TFT characteristics. The content of the impurity metal in the target can be measured by ICP or SIMS as in the crystalline oxide thin film. The "impurity" contained in the target is an element that is mixed in the raw material or during a manufacturing process and is not intentionally added, and means a trace element that does not substantially affect the performance of the target and the semiconductor. The "impurity metal" means a metal element among elements as an "impurity."

Further, the crystalline oxide thin film according to the exemplary embodiment can also be produced, for example, as a part of a laminate including the crystalline oxide thin film and a protective film.

A method of producing the laminate is exemplified by, with use of the sputtering target according to the exemplary embodiment and with use of one or more kinds of gases selected from the group consisting of argon and oxygen which are substantially free of impurity gas as the sputtering gas, forming an oxide thin film by sputtering, forming a protective film on the oxide thin film without subjecting the oxide thin film to heat treatment in an oxidizing atmosphere, and subjecting a laminate containing the oxide thin film and the protective film to heat treatment.

The oxide thin film obtained by forming a thin film by sputtering with use of a sputtering target containing indium oxide as a main component and with use of one or more kinds of gases, as a sputtering gas, selected from the group consisting of argon and oxygen which are substantially free of impurities is an amorphous oxide thin film. By patterning this oxide thin film in an island shape by photolithography and heating to crystallize the oxide thin film before forming the protective film, the crystalline oxide thin film having a single crystal orientation as a surface crystal can be obtained.

Each of steps will be described below.

Oxide Thin Film Formation

Figure 2A:
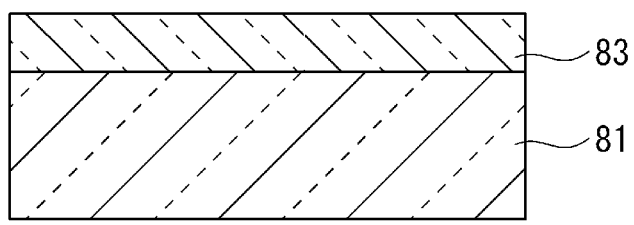
FIG. 2A shows a vertical cross section showing a state after an oxide thin-film is formed on a glass substrate.

In the oxide thin film formation, an oxide thin film is formed by sputtering with use of a sputtering target according to the exemplary embodiment and with use of one or more kinds of gases, as a sputtering gas, selected from the group consisting of argon and oxygen which are substantially free of impurity gas (see, for instance, FIG. 2A). FIG. 2A shows an oxide thin film 83 formed on a glass substrate 81.

The phrase "substantially free of impurity gas" in the sputtering gas means not positively inputting impurity gas other than argon and oxygen, except for the introduction of adsorbed water due to the insertion of gas and unavoidable gas (unavoidable impurity gas) such as chamber leak and adsorbed gas. In the exemplary embodiment, as the sputtering gas, for example, a commercially available mixed gas of high-purity argon and high-purity oxygen can be used. If possible, impurities are preferably removed from the sputtering gas.

A ratio of the impurity gas in the sputtering gas is preferably 0.1% by volume or less, and more preferably 0.05% by volume or less. When the ratio of the impurity gas is 0.1% by volume or less, crystallization of the oxide thin film proceeds without any difficulty.

The purity of high-purity argon and high-purity oxygen is preferably 99% by volume or more, more preferably 99.9% by volume or more, further preferably 99.99% by volume or more.

An oxygen partial pressure in the mixed gas of argon and oxygen is preferably more than 0% by volume and 10% by volume or less, and more preferably more than 0% by volume and 5% by volume or less. When the oxygen partial pressure is more than 0% by volume and 10% by volume or less, the oxide thin film is easily crystallized by heating to become a semiconductor. By changing the oxygen partial pressure, the degree of oxidation of the oxide thin film, that is, the degree of crystallization can be adjusted. The oxygen partial pressure may be appropriately selected as needed.

A magnetic flux density during sputtering is preferably 700 G or more. When the magnetic flux density during the sputtering is 700 G or more, a plasma density during the sputtering film formation can be increased, the density of the oxide thin film increases, and crystal nuclei are likely to be formed during annealing after patterning, resulting in controlling crystal grains to be small.

Even if the magnetic flux density during sputtering is less than 700 G, the plasma density during sputtering film formation can be increased by increasing an output density during sputtering to 2.5 kW/cm$^2$ or more, resulting in controlling the crystal grains in the oxide thin film to be small.

In the oxide thin film formation, it is preferable to mount the sputtering target according to the exemplary embodiment on an RF magnetron sputtering apparatus or a DC magnetron sputtering apparatus for sputtering.

The sputtering target according to the exemplary embodiment preferably contains the indium element, gallium element, and lanthanoid element.

By adding not only the indium element but also the gallium element and the lanthanoid element to the sputtering target, a uniform amorphous structure can be obtained when the oxide thin film is formed.

With the sputtering target according to the exemplary embodiment containing the indium element, gallium element, and lanthanoid element (for example, samarium element), an amorphous oxide thin film can be obtained at the film formation without introducing noble gas and oxygen (for example, water) into the sputtering gas. By heating this oxide thin film by a heat treatment described later, columnar crystals can be grown on the support. Applying the oxide thin film formed as described above to a compact TFT enables to provide a compact TFT device having excellent electron carrier injection property at the time of driving and, as a result, excellent trap limiting conduction region characteristics.

Protective Film Formation

When a protective film is formed on the crystalline oxide thin film, it is preferable that the obtained oxide thin film is subjected to the heat treatment in an oxidizing atmosphere and then the protective film is formed on the oxide thin film. By annealing before forming the protective film, oxygen is shared on the surface of the oxide thin film, so that a compact TFT device with few interfacial electron trap levels and excellent trap limiting conductivity region characteristics can be obtained after the protective film is formed.

Examples of the material of the protective film include $SiO_2$, $SiN_x$, $SiON_x$, $Al_2O_3$ and $Ga_2O_3$. A thickness of the protective film is usually in a range from 50 nm to 500 nm.

Figure 2B:
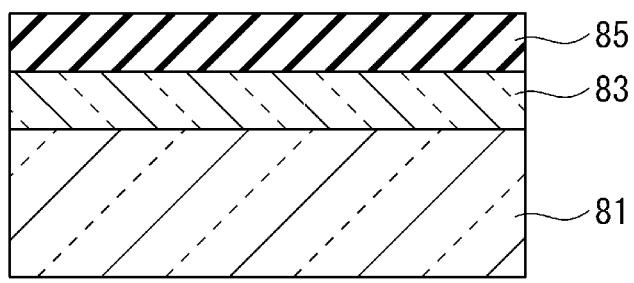
FIG. 2B shows a state after an SiO$_2$ film is formed on the oxide thin-film shown in FIG. 2A.

Examples of the method of forming the protective film include a CVD method, a sputtering method, and a coating method. FIG. 2B shows a state in which the $SiO_2$ film 85 is formed on the oxide thin film 83 in FIG. 2A.

Heat Treatment

Next, after forming the oxide thin film or forming the protective film, the heat treatment is performed. This heat treatment is sometimes referred to as annealing.

A temperature at the heat treatment is preferably in a range from 250 degrees C. to 500 degrees C., more preferably from 280 degrees C. to 470 degrees C., further preferably from 300 degrees C. to 450 degrees C.

When the heat treatment temperature after the oxide thin film is formed is 250 degrees C. or more, the oxide thin film is easily crystallized.

When the heat treatment temperature after the oxide thin film is formed is 500 degrees C. or less, abnormal growth of crystals and, consequently, enlargement of crystal grains can be prevented and a crystal grain size can be controlled to be small.

A heating time in the heat treatment is preferably in a range from 0.1 hours to 5 hours, more preferably from 0.3 hours to 3 hours, further preferably from 0.5 hours to 2 hours.

When the heating time in the heat treatment is 0.1 hours or more, the oxide thin film is always crystallized, rather easily crystallized.

When the heating time in the heat treatment is 5 hours or less, this heat treatment is economically excellent.

The "heating time" means the time (retention time) for maintaining a predetermined highest temperature during the heat treatment.

A temperature rise rate in the heat treatment is preferably in a range from 2 degrees C./min to 40 degrees C./min, and more preferably 3 degrees C./min to 20 degrees C./min.

When the temperature rise rate in the heat treatment is 2 degrees C./min or more, the production efficiency of the oxide thin film is improved as compared with a case where the temperature rise rate is less than 1 degree C./min.

When the temperature rise rate in the heat treatment is 40 degrees C./min or less, at the time of crystallization, the metal elements are uniformly diffused, and crystals in which no metal is segregated can be formed at the grain boundaries.

Further, the temperature rise rate in the heat treatment is different from a value calculated from a set temperature and a set time of a furnace, and is a value obtained by dividing the actual temperature of the oxide thin film by the time. The actual temperature of the oxide thin film can be determined, for example, by measuring an area within 1 cm from the oxide thin film in the furnace with a thermocouple.

The heat treatment is preferably performed in an air atmosphere.

The heat treatment is preferably performed after the oxide thin film is patterned. By performing the heat treatment after patterning, crystallization of the oxide thin film can be promoted while desorbing excess oxygen existing in the film during the film formation and organic substances adhering during patterning. As a result, a film having no organic substances or excess oxygen and having few crystal defects in the crystal grains can be formed, and an oxide thin film having few electron traps and favorable conductivity can be formed.

It is preferable to further perform the heat treatment after forming the gate insulating film and before forming the contact hole, or after forming the gate insulating film and the contact hole. In some cases, the heat treatment performed after patterning the oxide thin film is referred to as a first heat treatment, and the heat treatment performed after the gate insulating film is formed and before the contact hole is formed, or after the gate insulating film and the contact hole are formed is referred to as a second heat treatment. The second heat treatment is preferably performed at a higher annealing temperature than that of the first heat treatment. By annealing after forming the gate insulating film, hydrogen contained in the gate insulating film diffuses to the oxide thin film, and crystal defects existing on the surface of the oxide thin film are terminated by a hydroxyl group. As a result, an oxide thin film having few electron traps and favorable conductivity can be formed.

According to the production method of the crystalline oxide thin film of the exemplary embodiment, the crystalline oxide thin film having an average crystal grain size in a range from 0.05 μm to 0.5 μm can be obtained. As a result, the compact TFT having the crystalline oxide thin film formed by the production method of the crystalline oxide thin film according to the exemplary embodiment exhibits favorable trap limiting conductivity region characteristics.

3. Laminate

A laminate according to the exemplary embodiment includes the crystalline oxide thin film according to the exemplary embodiment and a support supporting the crystalline oxide thin film.

FIG. 1 schematically shows a cross-section of a laminate 10 as an example of the exemplary embodiment. The laminate 10 includes a crystalline oxide thin film 11 and a support 12 supporting the crystalline oxide thin film 11.

In the laminate 10, the average grain-boundary angle θsub formed by a surface of the support 12 and the crystal grain boundaries in the crystalline oxide thin film 11 is in a range from 70 degrees to 110 degrees, and the average interval $D_2$ between the crystal grain boundary in the crystalline oxide thin film 11 is preferably in a range from 0.01 μm to 0.5 μm.

When the average grain-boundary angle θsub formed between the surface of the support 12 and the crystal grain boundaries in the crystalline oxide thin film 11 and the average interval $D_2$ between the crystal grain boundaries satisfy the above ranges, the crystal grain boundaries can be densely present on the surface of the support 12 with which the crystalline oxide thin film 11 is in contact. As a result, when the crystalline oxide thin film 11 is in contact with an electrode as a support (for example, a source electrode), crystal grain boundaries are densely present with respect to a surface of the electrode. As a result, even when the contact region with the electrode is narrow (for example, a compact TFT), electron injection into the crystalline oxide thin film can be ensured, and a decrease in mobility can be suppressed.

4. Thin Film Transistor and Electronic Device

A thin film transistor (TFT) according to the exemplary embodiment includes electrodes, the crystalline oxide thin film, and an insulating film. Examples of the electrodes include a source electrode, a drain electrode, and a gate electrode. Examples of the insulating film include a gate insulating film and a protective film.

In a cross-sectional TEM observation cut out along a channel length direction of the thin film transistor according to the exemplary embodiment, the contact region length Ls between an electrode and the crystalline oxide thin film and the average interval $D_2$ between the crystal grain boundaries in the crystalline oxide thin film satisfy relationships of a formula (4) and a formula (5).

$$1 \ \mu m \leq Ls \leq 50 \ \mu m \quad (4)$$

$$10 \leq Ls/D_2 \leq 1000 \quad (5)$$

In the thin film transistor according to the exemplary embodiment, the crystalline oxide thin film is preferably in contact with the source electrode serving as the electrode. The contact region length Ls in contact with the source electrode preferably satisfies the relationship of the formula (4). Further, the source electrode and the crystalline oxide thin film in contact with the source electrode preferably satisfy the relationship of the formula (5).

In the thin film transistor according to the exemplary embodiment, the crystalline oxide thin film is preferably the crystalline oxide thin film according to the exemplary embodiment.

The thin film transistor exhibits an excellent mobility by satisfying the relationships of the above formulae (4) and (5), even if the contact region between the electrode and the oxide semiconductor layer is small.

In TFT manufactured by a conventional art, the source electrode and the drain electrode are formed on the oxide thin film using a metal mask. For example, the contact region length between the source electrode and the oxide thin film is about 100 μm. Accordingly, even if the crystal grain size of the oxide thin film is 1 μm or more, about 100 crystal grain boundaries exist in the contact region with the source electrode, and the crystal grain boundaries which are conductive regions with respect to the source electrode are present in a sufficient number in contact with the source electrode, which is not so disadvantageous in terms of mobility.

However, in recent years, a device size of TFT has been reduced in order to increase an aperture ratio in a display such as an OLED. Therefore, it is necessary to control characteristics of a compact TFT patterned by photolithography instead of the conventional film formation using a metal mask. In the compact TFT structure, the contact region length between the source electrode and the oxide thin film is shortened. Even in a TFT structure with a short contact region length, it is necessary to have a sufficient number of crystal grain boundaries in the contact region with the source electrode in order to obtain sufficient mobility. The TFT according to the exemplary embodiment exhibits an excellent mobility since satisfying the formulae (4) and (5).

The contact region length Ls more preferably satisfies a formula (4A) below, and further preferably satisfies a formula (4B) below.

$$2 \ \mu m \leq Ls \leq 50 \ \mu m \quad (4A)$$

$$2 \ \mu m \leq Ls \leq 10 \ \mu m \quad (4B)$$

$Ls/D_2$ more preferably satisfies a formula (5A) below, and further preferably satisfies a formula (5B) below.

$$10 \leq Ls/D_2 \leq 1000 \quad (5A)$$

$$10 \leq Ls/D_2 \leq 250 \quad (5B)$$

The thin film transistor according to the exemplary embodiment preferably includes the source electrode, the drain electrode, the gate electrode, the gate insulating film, the protective insulating film, and the oxide semiconductor layer.

The oxide semiconductor layer is positioned between the gate insulating film and the protective insulating film. The oxide semiconductor layer includes the crystalline oxide thin film according to the exemplary embodiment.

As the structure of the TFT according to the exemplary embodiment, for example, a conventionally known structure can be adopted.

The TFT according to the exemplary embodiment can be produced by adopting the production method of the crystalline oxide thin film according to the exemplary embodiment. Specifically, the production method includes: with use of the sputtering target according to the exemplary embodiment and with use of one or more kinds of gases, as a sputtering gas, selected from the group consisting of argon and oxygen which are substantially free of impurities, forming an oxide thin film by sputtering (sometimes referred to as the film formation); and applying a heat treatment to the oxide thin film (sometimes referred to as the heat treatment). Conditions and the like of the film formation and the heat treatment are the same as described above. The source electrode, the drain electrode, the gate electrode, and the gate insulating film can be formed using known materials through known forming methods.

The crystalline oxide thin film according to the exemplary embodiment exhibits favorable trap limiting conductivity region characteristics. A TFT has high trap limiting conductivity region characteristics by using such a crystalline oxide thin film as an oxide semiconductor layer (channel layer) of the TFT. The trap limiting conductivity region characteristics here refer to a mobility at the time of application of Vg=5 V. A mobility at the time of application of Vg=0.1 V is obtained as linear mobility. A mobility at the time of application of Vg=10 V or Vg=20 V is defined using a saturation mobility as an index.

Specifically, the trap limiting conductivity region characteristics can be calculated by creating a transfer characteristics Id-Vg graph when each Vd is applied, calculating transconductance (Gm) of each Vg, and obtaining a mobility using a formula for a linear region or a saturation region. A current Id is a current between the source and drain electrodes. A voltage Vd is a voltage applied between the source and drain electrodes (drain voltage). The voltage Vg is a voltage applied between the source and gate electrodes (gate voltage). The trap limiting conductivity region characteristics is preferably 17 cm$^2$/(V·s) or more, further preferably 19 cm$^2$/(V·s) or more.

The crystalline oxide thin film according to the exemplary embodiment can also form a Schottky barrier diode by arranging an ohmic electrode such as a metal, ITO or IZO on one surface thereof, and arranging a Schottky electrode such as a metal or oxide electrode having a work function of 4.8 eV or more on the other surface thereof.

The thin film transistor according to exemplary embodiment, a shape of which is not particularly limited, is preferably a back channel etch type transistor, an etch stopper type transistor, a top gate type transistor, or the like.

Figure 3:
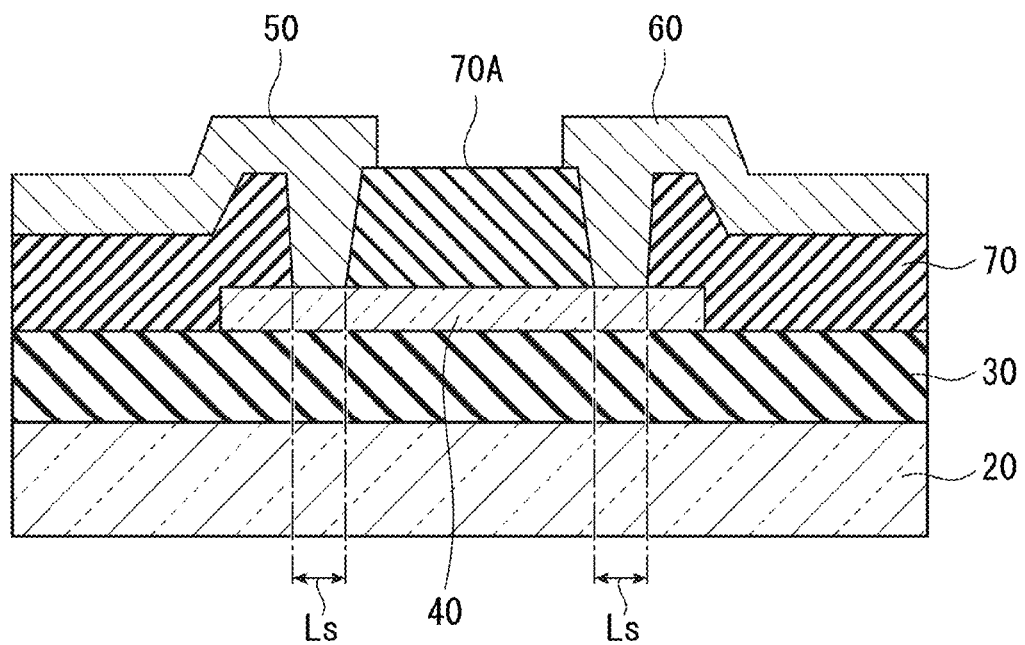
FIG. 3 shows a vertical cross section of a thin film transistor according to another exemplary embodiment of the invention.
Figure 4:
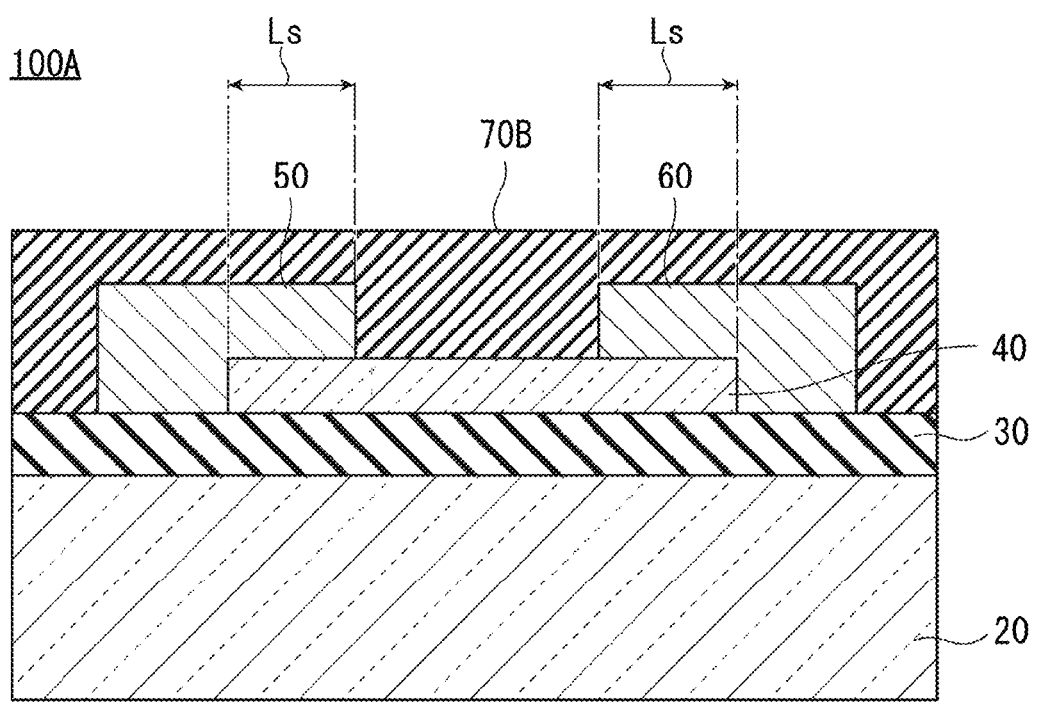
FIG. 4 shows a vertical cross section of a thin film transistor according to still another exemplary embodiment of the invention.

Specific examples of the thin film transistor are shown in FIGS. 3 and 4.

As shown in FIG. 3, a thin film transistor 100 includes a silicon wafer 20, a gate insulating film 30, an oxide thin film 40, a source electrode 50, a drain electrode 60, and interlayer insulating films 70, 70A.

The silicon wafer 20 is a gate electrode, and is provided on the gate insulating film 30 so as to face the oxide thin film 40 with the gate insulating film 30 interposed therebetween. The gate insulating film 30, which is an insulating film that blocks conduction between the gate electrode and the oxide thin film 40, is provided on the silicon wafer 20 and to one surface of the oxide thin film 40.

The oxide thin film 40, which is a channel layer, is provided on the gate insulating film 30. The crystalline oxide thin film according to the exemplary embodiment is usable as the oxide thin film 40. In the exemplary embodiment, when the thin film transistor 100 is a compact TFT, the oxide thin film 40 as a channel layer with respect to the source electrode 50 and the drain electrode 60 has a channel length (L length) in a range from 1 μm to 50 μm or less and a channel width (W length) in a range from 1 μm to 80 μm.

The source electrode 50 and the drain electrode 60 are conductive terminals for passing the source current and the drain current through the oxide thin film 40, and are respectively provided in the vicinity of both ends of the oxide thin film 40 in a manner to be in contact with the oxide thin film 40, leading to electrical connection with the oxide thin film 40.

An interlayer insulating film 70 is an insulating film that blocks conduction between the source electrode 50 and the drain electrode 60, and the oxide thin film 40 except for a contact portion therebetween.

An interlayer insulating film 70A is an insulating film that blocks conduction between the source electrode 50 and the drain electrode 60, and the oxide thin film 40 except for a contact portion therebetween. The interlayer insulating film 70A is also an insulating film that blocks conduction between the source electrode 50 and the drain electrode 60. The interlayer insulating film 70A is also a channel-layer protective layer.

As shown in FIG. 4, a structure of a thin film transistor 100A is the same as that of the thin film transistor 100, but is different from the thin film transistor 100 in that the source electrode 50 and the drain electrode 60 each are provided in a manner to be in contact with both the gate insulating film 30 and the oxide thin film 40. The thin film transistor 100A is also different from the thin film transistor 100 in that an interlayer insulating film 70B is integrally provided so as to cover the gate insulating film 30, the oxide thin film 40, the source electrode 50, and the drain electrode 60.

The material for forming the drain electrode 60, the source electrode 50 and the gate electrode is not particularly limited. As the material, a generally used material can be selected as desired. In Examples given in FIGS. 3 and 4, a silicon wafer is used as a substrate, however, the electrode material is not limited to silicon although the silicon wafer also acts as the electrode.

For example, transparent electrodes such as indium tin oxide (ITO), indium zinc oxide (IZO), ZnO, and $SnO_2$, metal electrodes such as Al, Ag, Cu, Cr, Ni, Mo, Au, Ti, and Ta, metal electrodes of alloys thereof, or layered electrodes thereof can be used.

Further, as shown in FIGS. 3 and 4, the gate electrode may be formed on a substrate such as glass.

The material for the interlayer insulating films 70, 70A and 70B is not particularly limited but may be selected as desired from generally known materials. Specific examples of the materials forming the interlayer insulating films 70, 70A and 70B include compounds such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, and AlN.

When the thin film transistor according to the exemplary embodiment is a back channel etch type (bottom gate type), it is preferable to provide a protective film on the drain electrode, the source electrode and the channel layer. The protective film enhances the durability against a long-term driving of the TFT. In a top-gate TFT, the gate insulating film is formed on, for instance, the channel layer.

The protective film or insulating film can be formed by, for example, CVD, which may result in a high temperature process. Further, since the protective film or the insulating film often contains an impurity gas immediately after the film formation, it is preferable to perform the heat treatment (annealing treatment). By removing the impurity gas by the heat treatment, a stable protective film or insulating film is obtained, which makes it easy to form a highly durable TFT device. Moreover, by annealing after forming the gate insulating film, hydrogen contained in the gate insulating film diffuses to the oxide thin film, and crystal defects existing on the surface of the oxide thin film are terminated by a hydroxyl group. As a result, an oxide thin film having few electron traps and favorable conductivity can be formed.

By using the oxide thin film according to the exemplary embodiment, the protective film or the insulating film is less likely to be affected by the temperature in the CVD process and the subsequent heat treatment. Therefore, even when the protective film or the insulating film is formed, stability of the TFT characteristics can be improved.

A threshold voltage (Vth) is preferably in a range from −3.0 V to 3.0 V, more preferably from −2.0 V to 2.0 V, further preferably from −1.0 V to 1.0 V. When a threshold voltage (Vth) is in a range from −3.0 V to 3.0 V, the threshold voltage (Vth) can be corrected to Vth=0V by installing a Vth correction circuit on the TFT. When the TFT obtained as a result is installed to a panel, a display can be driven without uneven brightness and burn-in.

The threshold voltage (Vth) is defined as Vg at $Id=10^{-9}$ A based on the graph of the transfer characteristics.

The On/Off ratio is preferably in a range from $10^6$ to $10^{12}$, more preferably from $10^7$ to $10^{11}$, further preferably from $10^8$ to $10^{10}$. At the On/Off ratio of $10^6$ or more, a liquid crystal display can be driven. When the on-off ratio is $10^{12}$ or less, an organic EL device having a large contrast can be driven. Moreover, when the on-off ratio is $10^{12}$ or less, the off current can be reduced to $10^{-12}$ A or less, and when the thin film transistor is used for a transfer transistor or a reset transistor of the CMOS image sensor, the image retention time can be lengthened and the sensitivity can be improved.

The On/Off ratio can be determined as a ratio [On current value/Off current value] of On current value (a value of Id when Vg=20 V) to Off current value (a value of Id when Vg=−10 V).

The Off current value is preferably $10^{-10}$ A or less, more preferably $10^{-11}$ A or less, further preferably $10^{-12}$ A or less. When the Off current value is $10^{-10}$ A or less, an organic EL device having a large contrast can be driven. Further, the image retention time can be increased and sensitivity can be enhanced when the thin film transistor is used for a transfer transistor or a reset transistor of a CMOS image sensor.

Quantum-Tunneling Field-Effect Transistor

The crystalline oxide thin film according to the exemplary embodiment can also be used for a quantum-tunneling field-effect transistor (FET).

Figure 5:
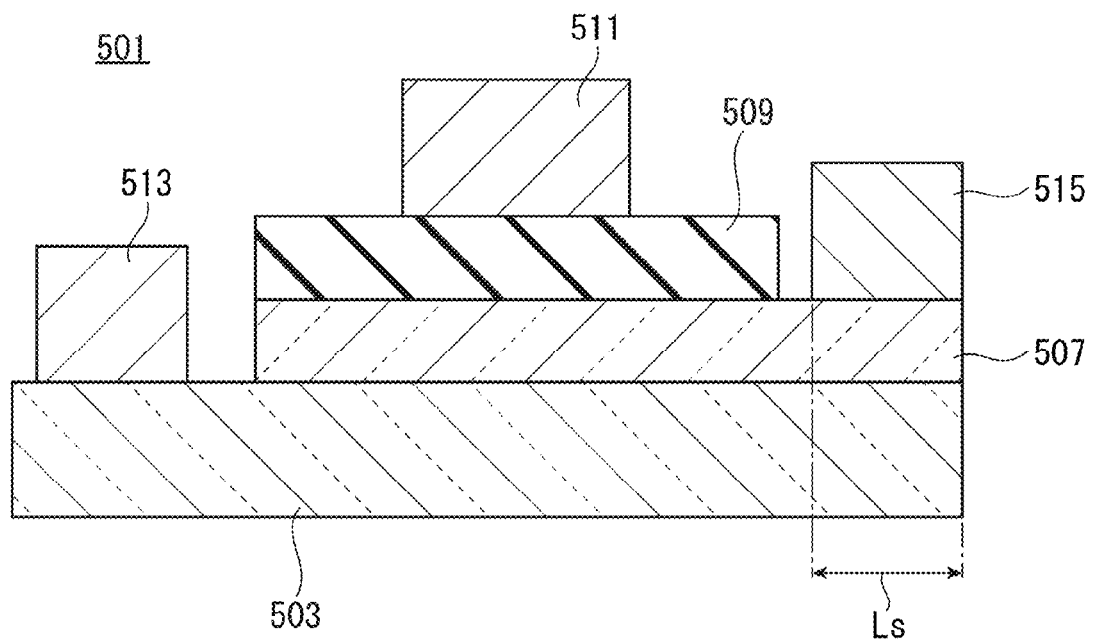
FIG. 5 shows a vertical cross section of a quantum-tunneling field-effect transistor according to a further exemplary embodiment of the invention.

FIG. 5 shows a schematic view (longitudinal cross-sectional view) of the quantum-tunneling field-effect transistor (FET) according to the exemplary embodiment.

A quantum-tunneling field-effect transistor 501 includes a p-type semiconductor layer 503, n-type semiconductor layer 507, gate insulating film 509, gate electrode 511, source electrode 513, and drain electrode 515.

The p-type semiconductor layer 503, n-type semiconductor layer 507, gate insulating film 509, and gate electrode 511 are layered in this order.

The source electrode 513 is provided on the p-type semiconductor layer 503. The drain electrode 515 is provided on the n-type semiconductor layer 507.

The p-type semiconductor layer 503 is a layer of a p-type IV group semiconductor layer, which is a p-type silicon layer in the exemplary embodiment.

The n-type semiconductor layer 507 is an n-type oxide thin film used in the image sensor according to the exemplary embodiment. The source electrode 513 and the drain electrode 515 are conductive films.

Though not shown in FIG. 5, an insulation layer may be provided on the p-type semiconductor layer 503. In this case, the p-type semiconductor layer 503 and the n-type semiconductor layer 507 are connected through a contact hole(s) defined by partially removing the insulation layer. Though not shown in FIG. 5, the quantum-tunneling field-effect transistor 501 may be provided with an interlayer insulating film covering an upper side of the quantum-tunneling field-effect transistor 501.

The quantum-tunneling field-effect transistor 501 is a current-switching quantum-tunneling FET (Field-Effect Transistor) for controlling the electric current tunneled through an energy barrier formed by the p-type semiconductor layer 503 and the n-type semiconductor layer 507 using a voltage applied to the gate electrode 511. With this structure, the band gap of the oxide semiconductor of the n-type semiconductor layer 507 can be increased, thereby decreasing the off current.

Figure 6:
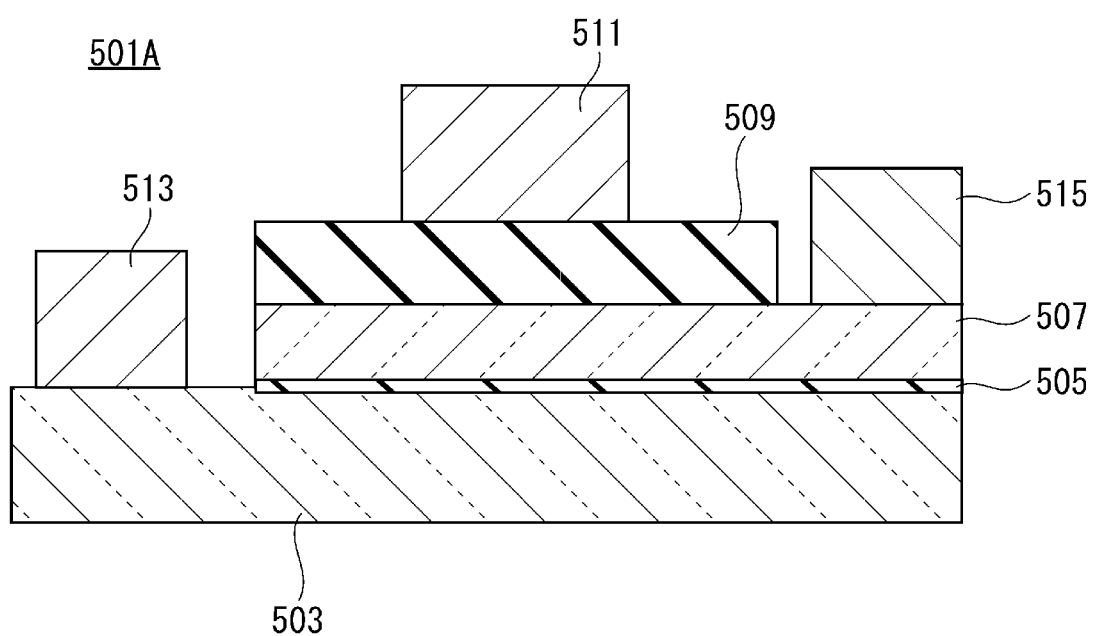
FIG. 6 shows a vertical cross section of a quantum-tunneling field-effect transistor according to a still further exemplary embodiment of the invention.

FIG. 6 shows a schematic view (longitudinal cross-sectional view) of a quantum-tunneling field-effect transistor 501A according to another exemplary embodiment.

The structure of the quantum-tunneling field-effect transistor 501A is the same as the structure of the quantum-tunneling field-effect transistor 501 except that a silicon oxide layer 505 is interposed between the p-type semiconductor layer 503 and the n-type semiconductor layer 507. The off current can be reduced by the presence of the silicon oxide layer.

The thickness of the silicon oxide layer 505 is preferably 10 nm or less. At the thickness of 10 nm or less, the tunnel current securely passes through the energy barrier and the energy barrier can be securely formed with a constant barrier height, preventing the decrease or change in the tunneling current. The thickness is preferably 8 nm or less, more preferably 5 nm or less, further preferably 3 nm or less, and especially preferably 1 nm or less.

Figure 7:
FIG. 7 is a TEM (transmission electron microscope) photograph showing a silicon oxide layer formed between a p-type semiconductor layer and an n-type semiconductor layer in FIG. 5.

FIG. 7 is a TEM photograph showing the silicon oxide layer 505 between the p-type semiconductor layer 503 and the n-type semiconductor layer 507.

The n-type semiconductor layer 507 in both of the quantum-tunneling field-effect transistors 501 and 501A is an n-type oxide semiconductor.

The oxide semiconductor of the n-type semiconductor layer 507 may be amorphous. The amorphous oxide semiconductor can be etched using an organic acid (e.g. oxalic acid) at a large difference in etching rate from the other layer(s), so that the etching process can be favorably performed without any influence on the metal layer (e.g. wiring).

The oxide semiconductor forming the n-type semiconductor layer 507 may be crystalline. Since the oxide semiconductor forming the n-type semiconductor layer 507 is crystalline, a bandgap becomes larger than that of the oxide semiconductor being amorphous, so that the off-current can be reduced. Further, since the work function can be increased, the control over the current tunneled through the energy barrier formed by the p-type IV group semiconductor material and the n-type semiconductor layer 507 can be facilitated.

A non-limiting example of the production method of the quantum-tunneling field-effect transistor 501 will be described below.

Figure 8A:
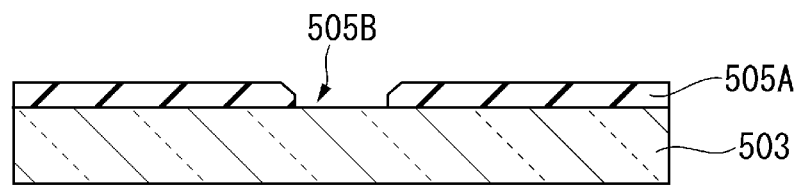
FIG. 8A shows a vertical cross section for explaining a production procedure of a quantum-tunneling field-effect transistor.

Initially, as shown in FIG. 8A, an insulation film 505A is formed on the p-type semiconductor layer 503. Then, a part of the insulation film 505A is removed by etching or the like to form a contact hole 505B.

Figure 8B:
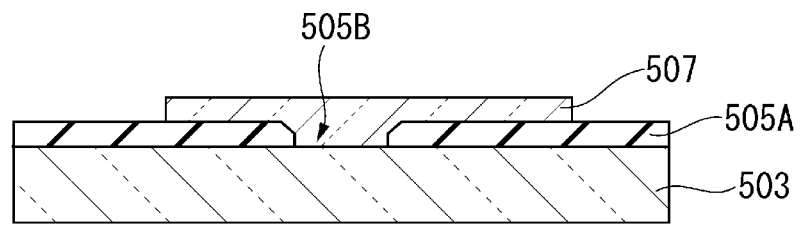
FIG. 8B shows another vertical cross section for explaining the production procedure of the quantum-tunneling field-effect transistor.

Next, as shown in FIG. 8B, the n-type semiconductor layer 507 is formed on the p-type semiconductor layer 503 and the insulating film 505A. At this time, the p-type semiconductor layer 503 and the n-type semiconductor layer 507 are connected through the contact hole 505B.

Figure 8C:
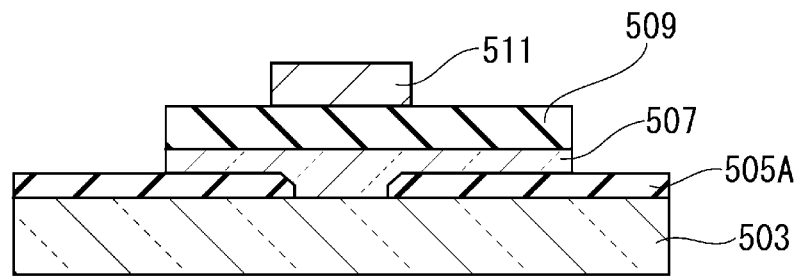
FIG. 8C shows still another vertical cross section for explaining the production procedure of the quantum-tunneling field-effect transistor.

Next, as shown in FIG. 8C, the gate insulating film 509 and the gate electrode 511 are formed in this order on the n-type semiconductor layer 507.

Figure 8D:
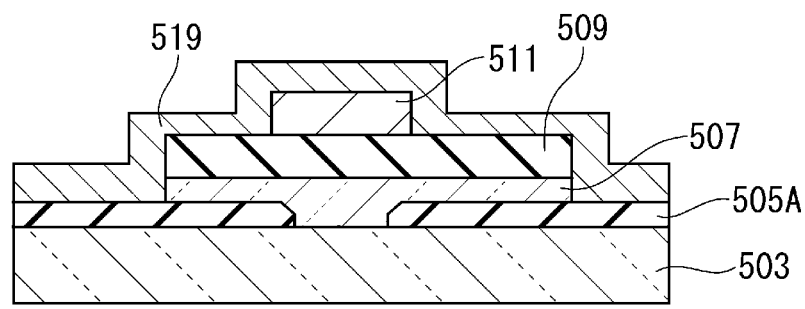
FIG. 8D shows a further vertical cross section for explaining the production procedure of the quantum-tunneling field-effect transistor.

Next, as shown in FIG. 8D, an interlayer insulating film 519 is provided in a manner to cover the insulating film 505A, the n-type semiconductor layer 507, the gate insulating film 509, and the gate electrode 511.

Figure 8E:
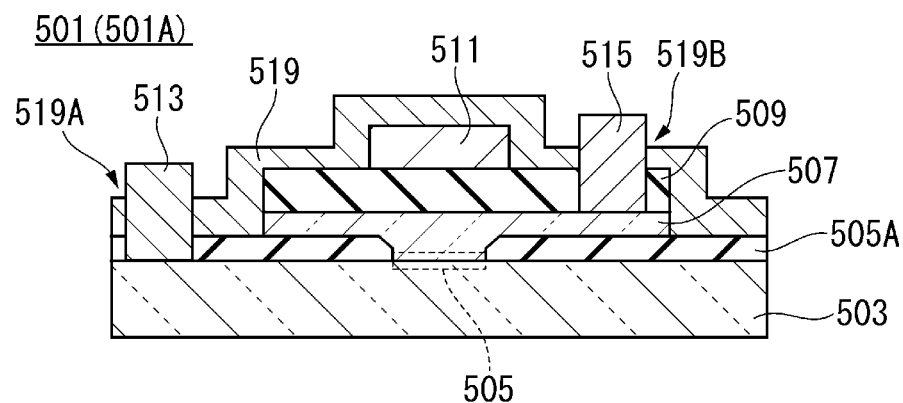
FIG. 8E shows a still further vertical cross section for explaining the production procedure of the quantum-tunneling field-effect transistor.

Next, as shown in FIG. 8E, a contact hole 519A is formed by opening a part of the insulating film 505A and the interlayer insulating film 519 on the p-type semiconductor layer 503, and the source electrode 513 is provided in the contact hole 519A.

Further, as shown in FIG. 8E, a contact hole 519B is formed by opening a part of the gate insulating film 509 and the interlayer insulating film 519 on the n-type semiconductor layer 507, and the drain electrode 515 is formed in the contact hole 519B.

The quantum-tunneling field-effect transistor 501 is produced through the above process.

It should be noted that the silicon oxide layer 505 between the p-type semiconductor layer 503 and the n-type semiconductor layer 507 can be formed by applying a heat treatment at a temperature ranging from 150 degrees C. to 600 degrees C. after the n-type semiconductor layer 507 is formed on the p-type semiconductor layer 503. The quantum-tunneling field-effect transistor 501A can be produced through the process including the above additional step.

The TFT according to the exemplary embodiment can be suitably used for display devices such as solar cells, liquid crystal devices, organic electroluminescence devices, and inorganic electroluminescence devices, power semiconductor devices, and electronic devices such as touch panels.

The thin film transistor according to the exemplary embodiment can be applied to various integrated circuits such as a field effect transistor, logic circuit, memory circuit, and differential amplification circuit, and the various integrated circuits can be applied to an electronic device and the like. Further, the thin film transistor according to the exemplary embodiment can be applied not only to the field effect transistor but also to an electrostatic induction transistor and a Schottky barrier transistor.

The thin film transistor according to the exemplary embodiment can be suitably used for a display device such as a portable or in-vehicle display device, a solid-state image sensor, and the like. Further, the thin film transistor according to the exemplary embodiment can also be suitably used as a transistor for a flat panel detector for an X-ray image sensor for medical use.

Further, the crystalline oxide thin film according to the exemplary embodiment can be applied to a Schottky diode, a resistance change type memory, and a resistor.

Hereinafter, a case where the thin film transistor according to the exemplary embodiment is used for a display device and a solid-state image sensor will be described.

Firstly, a case where the thin film transistor according to the exemplary embodiment is used for a display device will be described with reference to FIG. 9.

Figure 9A:
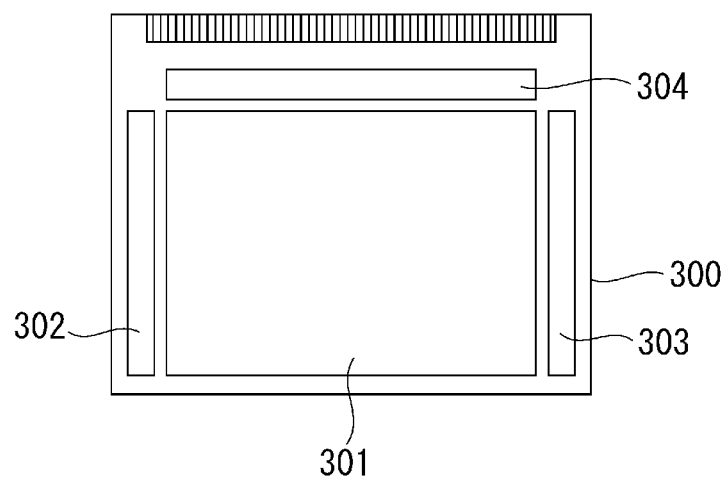
FIG. 9A shows a plan view of a display device using the thin film transistor according to the above exemplary embodiment of the invention.
Figure 9B:
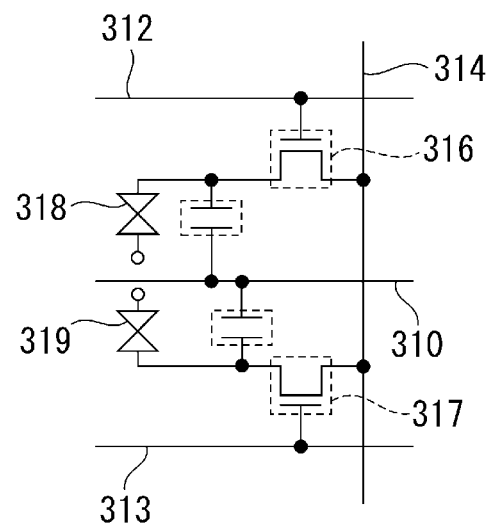
FIG. 9B is a circuit diagram for explaining a circuit of a pixel unit of another display device using the thin film transistor according to the above exemplary embodiment of the invention.
Figure 9C:
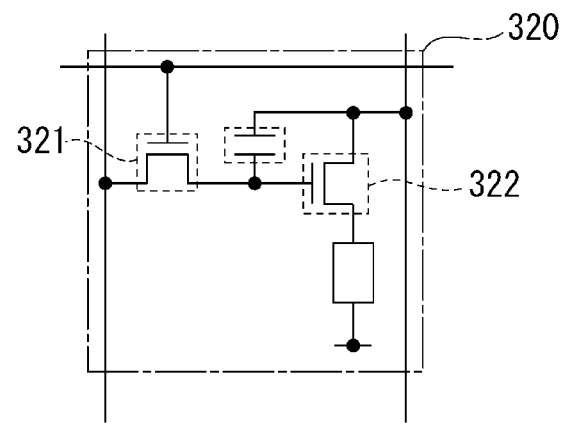
FIG. 9C is a circuit diagram for explaining a circuit of a pixel unit of a display device using the thin film transistor according to the above exemplary embodiment of the invention.

FIG. 9A shows a plan view of a display device according to the exemplary embodiment. FIG. 9B is a circuit diagram for explaining a circuit of a pixel unit when a liquid crystal element is applied to the pixel unit of the display device according to the exemplary embodiment. FIG. 9C is a circuit diagram for explaining a circuit of a pixel unit when an organic EL device is applied to the pixel unit of the display device according to the exemplary embodiment.

The transistor in the pixel unit may be the thin film transistor of the exemplary embodiment. The thin film transistor of the exemplary embodiment is easily made into an n-channel type. Accordingly, a part of the drive circuit capable of being provided by an n-channel transistor is formed on the same substrate as the transistor of the pixel unit. A highly reliable display device can be provided using the thin film transistor of the exemplary embodiment for the pixel unit and/or the drive circuit.

FIG. 9A is a top plan view showing an example of an active matrix display device. The display device includes a substrate 300, and a pixel unit 301, a first scan line drive circuit 302, a second scan line drive circuit 303, and a signal line drive circuit 304 formed on the substrate 300. Multiple signal lines extend from the signal line drive circuit 304 to the pixel unit 301. Multiple scan lines extend from the first scan line drive circuit 302 and the second scan line drive circuit 303 to the pixel unit 301. Pixels each including a display element are provided in a matrix at intersections of the scan lines and the signal lines. The substrate 300 of the display device is connected to a timing controller (controller, also referred to as a control IC) through a connector such as an FPC (Flexible Printed Circuit).

As shown in FIG. 9A, the first scan line drive circuit 302, the second scan line drive circuit 303, and the signal line drive circuit 304 are provided on the same substrate 300 as the pixel unit 301. Such an arrangement results in reduction in the number of external component (e.g. drive circuit) and, consequently, reduction in production cost. In addition, when the drive circuit is provided outside the substrate 300, the lines have to be extended and the connection between the lines increases. With the drive circuit being provided on the same substrate 300, the number of connections between the lines can be reduced, thereby improving the reliability and yield rate.

An example of a pixel circuit is shown in FIG. 9B. FIG. 16 shows a circuit of a pixel unit applicable to a pixel unit of a VA liquid crystal display device.

The circuit of the pixel unit is applicable to a device having a plurality of pixel electrodes in one pixel. The pixel electrodes are each connected to different transistors, whereby each of the transistors is drivable in accordance with a different gate signal. Thus, the signals to be applied to the respective pixel electrodes of a multi-domain structure can be independently controlled.

A gate line 312 of a transistor 316 and a gate line 313 of a transistor 317 are separated so that different gate signals are inputted thereto. In contrast, a source electrode or drain electrode 314 serving as a data line is common to the transistors 316 and 317. The transistors 316 and 317 may be the transistor of the exemplary embodiment. A highly reliable liquid crystal display device can be thereby provided.

First and second pixel electrodes are electrically connected to the transistors 316 and 317, respectively. The first pixel electrode is separated from the second pixel electrode. Shapes of the first and second pixel electrodes are not particularly limited. For instance, the first pixel electrode may be V-shaped.

Gate electrodes of the transistors 316 and 317 are connected with the gate lines 312 and 313, respectively. Different gate signals can be inputted to the gate lines 312 and 313 so that the transistors 316 and 317 are operated at different timings, thereby controlling orientation of the liquid crystal.

A capacity line 310, a gate insulating film serving as a dielectric, and a capacity electrode electrically connected with the first pixel electrode or the second pixel electrode may be provided to define a holding capacity.

In a multi-domain structure, first and second liquid crystal devices 318 and 319 are provided in one pixel. The first liquid crystal device 318 includes the first pixel electrode, an opposing electrode, and a liquid crystal layer interposed between the first pixel electrode and the opposing electrode. The second liquid crystal device 319 includes the second pixel electrode, an opposing electrode, and a liquid crystal layer interposed between the second pixel electrode and the opposing electrode.

The pixel unit is not necessarily arranged as shown in FIG. 9B. The pixel unit shown in FIG. 9B may additionally include a switch, a resistor, a capacitor, a transistor, a sensor, and/or a logic circuit.

Another example of the pixel circuit is shown in FIG. 9C. Illustrated is a structure of a pixel unit in a display device using an organic EL device.

FIG. 9C illustrates an applicable example of a circuit of a pixel unit 320. In this example, two n-channel transistors are used in one pixel. The crystalline oxide thin film of the exemplary embodiment is usable for a channel-formation region in the n-channel transistor. The circuit of the pixel unit can be driven according to digital pulse width modulation control.

A switching transistor 321 and a drive transistor 322 may be the thin film transistor according to the exemplary embodiment. A highly reliable organic EL display device can be thereby provided.

The circuit of the pixel unit is not necessarily arranged as shown in FIG. 9C. The circuit of the pixel unit shown in FIG. 9C may additionally include a switch, a resistor, a capacitor, a transistor, a sensor, and/or a logic circuit.

Further, in the display device using the thin film transistor according to the exemplary embodiment, both an Si-based transistor and the crystalline oxide transistor of the exemplary embodiment may be installed.

The thin film transistor of the exemplary embodiment used in a display device has been described above.

Next, a case where the thin film transistor according to the exemplary embodiment is used for a solid-state image sensor will be described with reference to FIG. 10.

CMOS (Complementary Metal Oxide Semiconductor) image sensor is a solid-state image sensor including a signal charge accumulator for holding an electric potential, and an amplification transistor for transferring (outputting) the electric potential to a vertical output line. When the signal charge accumulator is charged or discharged by a possible leak current from the reset transistor and/or the transfer transistor of the CMOS image sensor, the electric potential of the signal charge accumulator changes. The change in the electric potential of the signal charge accumulator results in the change in the electric potential of the amplification transistor (i.e. shift from a desired value), deteriorating the quality of the captured image.

Operation effects of the thin-film transistor according to the exemplary embodiment of the invention incorporated in the reset transistor and the transfer transistor of the CMOS image sensor will be described below. As the amplification transistor, either a thin film transistor or a bulk transistor may be applied.

Figure 10:
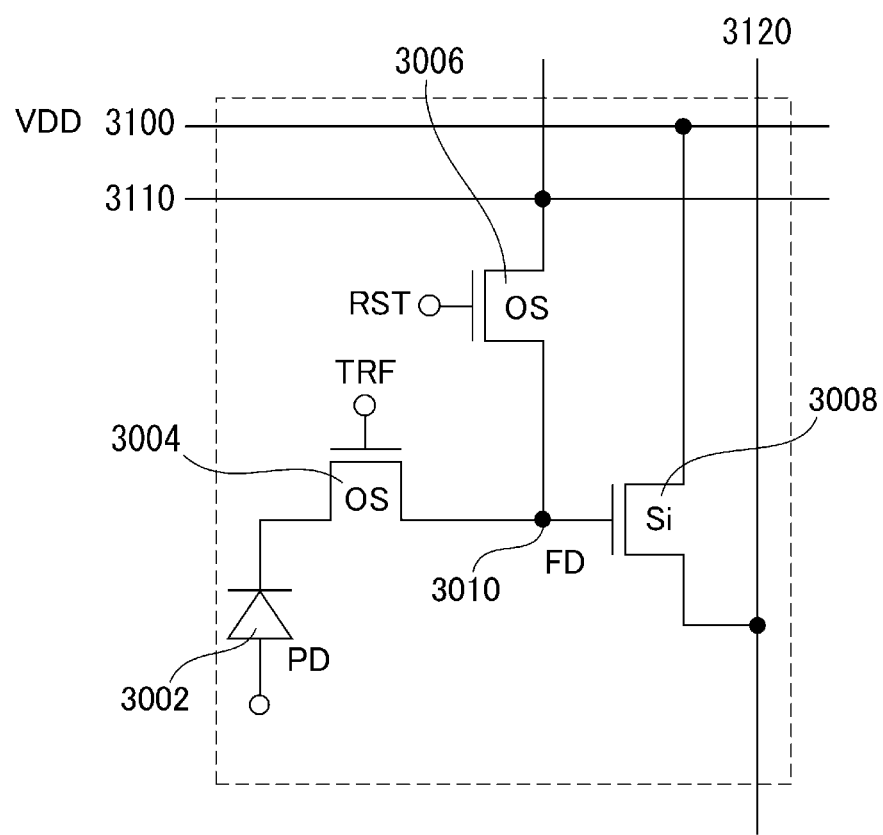
FIG. 10 is a circuit diagram for explaining a circuit of a pixel unit of a solid-state image sensor using the thin film transistor according to the above exemplary embodiment of the invention.

FIG. 10 illustrates an exemplary arrangement of the CMOS image sensor. The pixel includes a photodiode 3002 (photoelectric converter), a transfer transistor 3004, a reset transistor 3006, an amplification transistor 3008, and various lines. A plurality of the pixels are arranged in a matrix to form the sensor. A selector transistor may be electrically connected to the amplification transistor 3008. The characters in the transistor signs each represent a preferable material to be used for the transistors, where "OS" represents Oxide Semiconductor and "Si" represents silicon. The same applies to the other drawing(s).

The photodiode 3002 is connected to a source of the transfer transistor 3004. A signal charge accumulator 3010 (also referred to as FD (Floating Diffusion)) is provided to a drain of the transfer transistor 3004. The source of the reset transistor 3006 and the gate of the amplification transistor 3008 are connected to the signal charge accumulator 3010. A reset power line 3110 may be omitted in other embodiment. For instance, the drain of the reset transistor 3006 may be connected with a power line 3100 or a vertical output line 3120 instead of the reset power line 3110.

The oxide semiconductor film according to the exemplary embodiment of the invention, which may be made of the same material as the oxide semiconductor film used for the transfer transistor 3004 and the reset transistor 3006, may be used in the photodiode 3002.

The thin film transistor of the exemplary embodiment used in a solid-state image element has been described above.

EXAMPLES

Exemplary embodiment(s) of the invention will be specifically described below on a basis of Examples. The invention are by no means limited to Examples.
Production of Compact TFT Example 1

A thin film transistor was produced through steps below.
(1) Film Formation of Oxide Semiconductor Layer Sputtering targets respectively obtained from material mixtures having charging composition percentages shown in Table 1 were used. Table 1 shows metal composition percentages (unit: at %) in respective oxide sputtering targets.

Using each of the oxide sputtering targets, an oxide semiconductor thin film (oxide semiconductor layer) with a thickness of 50 nm was formed by sputtering on a silicon wafer (gate electrode) with a thermal oxide film (gate insulating film) having a thickness of 100 nm. Film forming conditions are as shown in Table 1. As the sputtering gas, a mixed gas of high-purity argon and high-purity oxygen (impurity gas concentration: 0.01% by volume) was used.
(2) Semiconductor Patterning Next, the formed oxide semiconductor layer was patterned in an island shape by photolithography.

First, a photoresist film was formed on the oxide semiconductor layer. As a photoresist, AZ1500 (manufactured by AZ Electronic Materials) was used. The formed photoresist film was exposed to light through a photomask in which a pattern was formed in a size of 14 µm×4 µm. After exposure, development was performed with tetramethylammonium hydroxide (TMAH). After development, the oxide semiconductor layer was etched with oxalic acid. After etching, the photoresist was stripped to obtain a substrate with the patterned oxide thin film. The obtained semiconductor area became smaller than the photomask pattern due to invasion of the etching solution, and was 12 µm×2.8 µm in size as shown in Table 1 and FIG. 11.
(3) Annealing Next, the substrate with the patterned oxide thin film was placed in a furnace, heated to 350 degrees C. at 10 degrees C./min in the air, and then kept for 1 hour. An inside of the furnace was kept at 350 degrees C. for 1 hour, then allowed to cool naturally, and after an internal temperature of the furnace returned to room temperature, the substrate with the oxide thin film was taken out from the furnace.
(4) Etch Stopper Patterning Subsequently, an image reversal resist was spin-coated on a semiconductor patterning surface of the substrate with the oxide thin film after annealing. As the image reversal resist, AZ5214 (manufactured by AZ Electronic Materials) was used. After the spin-coating, the image reversal resist was exposed to light through a photomask in which a pattern was formed in a size of 6 µm×6 µm. The image reversal resist AZ5214 was overall exposed to light after the reversal baking, and was developed with TMAH. A 100-nm-thick $SiO_2$ film was formed by sputtering on the substrate with the patterned resist. Sputtering conditions are as follows.

Substrate temperature: 25 degrees C.
Ultimate pressure: $8.5 \times 10^{-5}$ Pa
Atmosphere gas: $Ar+O_2$ ($O_2$ flow rate: 30%)
Sputtering pressure (full pressure): 0.4 Pa
Input voltage: RF 100 W
Distance between S (substrate) and T (target): 70 mm Then, the substrate formed with the $SiO_2$ film was lifted off in acetone, thereby patterning the $SiO_2$ film.
(5) Formation of Contact Hole of Gate Insulating Film Further, the substrate with the oxide thin film that was the patterned $SiO_2$ film was applied with a photoresist AZ1500 (manufactured by AZ Electronic Materials Co., Ltd.) and exposed to light through a photomask. After exposure, the photoresist AZ1500 was developed with tetramethylammonium hydroxide (TMAH). After development, Si (silicon wafer) with a thermal oxide film was etched with buffered hydrofluoric acid (BHF) to form a contact hole for taking out the gate electrode. After forming the contact hole, the substrate was annealed in the air at 400 degrees C. for one hour.
(6) Formation of Source and Drain Electrodes Subsequently, a layer of the source and drain electrodes was patterned by a lift-off process using the image reversal resist AZ5214 and a photomask. The image reversal resist AZ5214 was exposed to light through the photomask formed such that the image reversal resist AZ5214 was able to be patterned in line with the final device shape (L length: 6 µm, W length: 2.8 µm, Ls length of each of the source electrode and the drain electrode: 3 µm). After the reversal baking, the image reversal resist AZ5214 was overall exposed to light and developed with TMAH. A 150-nm-thick Ti layer was formed by the following sputtering conditions on the substrate with the patterned resist.

Substrate temperature: 25 degrees C.
Ultimate Pressure: $8.5 \times 10^{-5}$ Pa
Atmosphere gas: Ar
Sputtering pressure (full pressure): 0.4 Pa
Input voltage: DC 100 W
Distance between S (substrate) and T (target): 70 mm Subsequently, the substrate formed with the Ti layer was lifted off in acetone, thereby patterning an ohmic electrode layer.

(7) Final Annealing

Finally, the substrate was annealed in the air at 200 degrees C. for one hour. The final shapes of the obtained devices (compact TFT) are as shown in Table 1.

Examples 2 and 3

A compact TFT in each of Examples 2 and 3 was produced in the same manner as in Example 1 except that the charging composition percentages of the sputtering target and the production conditions of the compact TFT were changed to those shown in Table 1.

Comparatives 1 to 4

A compact TFT in each of Comparatives 1 to 4 was produced in the same manner as in Example 1 except that the charging composition percentages of the sputtering target and the production conditions of the compact TFT were changed to those shown in Table 1.

Examples 4 to 8

A compact TFT in each of Examples 4 to 8 was produced in the same manner as in Example 1 except that the charging composition percentages of the sputtering target and the production conditions of the compact TFT were changed to those shown in Table 2.

Comparatives 5 to 10

A compact TFT in each of Comparatives 5 to 10 was produced in the same manner as in Example 1 except that the charging composition percentages of the sputtering target and the production conditions of the compact TFT were changed to those shown in Tables 2 and 3.

TABLE 1

| | | | Example 1 | Example 2 | Example 3 | Comparative 1 | Comparative 2 | Comparative 3 | Comparative 4 |
|---|---|---|---|---|---|---|---|---|---|
| Oxide Sputtering Target | Charging Composition Ratio [mass %] | $In_2O_3$ | 92.0 | 91.0 | 90.0 | 90.0 | 90.0 | 95.0 | 44.2 |
| | | $Ga_2O_3$ | 5.0 | 6.8 | 7.0 | 5.0 | 7.0 | 5.0 | 29.9 |
| | | $Sm_2O_3$ | 3.0 | 2.2 | 3.0 | 5.0 | 3.0 | 0.0 | — |
| | | ZnO | — | — | — | — | — | — | 25.9 |
| | Metal Composition Ratio [at %] | In | 90.4 | 88.5 | 87.6 | 88.8 | 87.6 | 92.8 | 33 |
| | | Ga | 7.3 | 9.8 | 10.1 | 7.3 | 10.1 | 7.2 | 33 |
| | | Sm | 2.3 | 1.7 | 2.3 | 3.9 | 2.3 | 0.0 | — |
| | | Zn | — | — | — | — | — | — | 34 |
| Compact TFT Manufacture | Sputtering Film Forming Conditions of Oxide Semiconductor | Atmosphere gas | Ar + $O_2$ | Ar + $O_2$ | Ar + $O_2$ | Ar + $O_2$ | Ar + $O_2$ | Ar + $O_2$ | Ar + $O_2$ |
| | | Backpressure [Pa] before film formation | $4 \times 10^{-4}$ or less | $4 \times 10^{-4}$ or less | $4 \times 10^{-4}$ or less | $4 \times 10^{-4}$ or less | $4 \times 10^{-4}$ or less | $4 \times 10^{-4}$ or less | $4 \times 10^{-4}$ or less |
| | | Pressure [Pa] at film formation | 0.5 | 0.5 | 0.5 | 0.5 | 0.5 | 0.5 | 0.5 |
| | | Oxygen flowrate [%] at film formation | 10 | 10 | 10 | 10 | 10 | 30 | 10 |
| | | Water partial pressure [Pa] at film formation | — | — | — | — | — | — | — |
| | | Magnetic flux density [G] | 1000 | 1000 | 1000 | 1000 | 600 | 1000 | 1000 |
| | | Film thickness [nm] | 50 | 50 | 50 | 50 | 50 | 50 | 50 |
| | Semiconductor Patterning | Resist | AZ1500 | AZ1500 | AZ1500 | AZ1500 | AZ1500 | AZ1500 | AZ1500 |
| | | Semiconductor etching | oxalic acid | oxalic acid | oxalic acid | oxalic acid | oxalic acid | oxalic acid | oxalic acid |
| | Annealing | Temperature rise pattern [° C./min] | 10 | 10 | 10 | 10 | 10 | 10 | 10 |
| | | Highest temperature [° C.] | 350 | 350 | 350 | 350 | 350 | 350 | 350 |
| | | Retention time [hour] | 1 | 1 | 1 | 1 | 1 | 1 | 1 |
| | | Atmosphere | Air | Air | Air | Air | Air | Air | Air |
| | Etch Stopper Patterning | Etch Stopper | $SiO_2$ | $SiO_2$ | $SiO_2$ | $SiO_2$ | $SiO_2$ | $SiO_2$ | $SiO_2$ |
| | | Resist | AZ5214 | AZ5214 | AZ5214 | AZ5214 | AZ5214 | AZ5214 | AZ5214 |
| | Contact Hole Formation of Gate Insulating Film | Resist | AZ1500 | AZ1500 | AZ1500 | AZ1500 | AZ1500 | AZ1500 | AZ1500 |
| | | Etchant | BHF | BHF | BHF | BHF | BHF | BHF | BHF |
| | Annealing | Highest temperature [° C.] | 400 | 400 | 400 | 400 | 400 | 400 | 400 |
| | | Retention time [hour] | 1 | 1 | 1 | 1 | 1 | 1 | 1 |
| | | Atmosphere | in air | in air | in air | in air | in air | in air | in air |
| | Electrode Formation | Electrode | Ti | Ti | Ti | Ti | Ti | Ti | Ti |
| | | Resist | AZ5214 | AZ5214 | AZ5214 | AZ5214 | AZ5214 | AZ5214 | AZ5214 |
| | Final Annealing | Highest temperature [° C.] | 200 | 200 | 200 | 200 | 200 | 200 | 200 |
| | | Retention time [hour] | 1 | 1 | 1 | 1 | 1 | 1 | 1 |
| | | Atmosphere | in air | in air | in air | in air | in air | in air | in air |
| | Final Shape | L length [µm] | 6.0 | 6.0 | 6.0 | 6.0 | 6.0 | 6.0 | 6.0 |
| | | W length [µm] | 2.8 | 2.8 | 2.8 | 2.8 | 2.8 | 2.8 | 2.8 |
| | | Film thickness [nm] of gate insulating film | 100 | 100 | 100 | 100 | 100 | 100 | 100 |

TABLE 1-continued

|  | Example 1 | Example 2 | Example 3 | Comparative 1 | Comparative 2 | Comparative 3 | Comparative 4 |
|---|---|---|---|---|---|---|---|
| Semiconductor/drain electrode contact region length [μm] | 3.0 | 3.0 | 3.0 | 3.0 | 3.0 | 3.0 | 3.0 |
| Semiconductor/source electrode contact region length [μm] | 3.0 | 3.0 | 3.0 | 3.0 | 3.0 | 3.0 | 3.0 |

TABLE 2

|  |  |  | Example 4 | Example 5 | Example 6 | Example 7 | Example 8 | Comparative 5 | Comparative 6 | Comparative 7 |
|---|---|---|---|---|---|---|---|---|---|---|
| Oxide Sputtering Target | Charging Composition Ratio [mass %] | In₂O₃ | 88.0 | 89.0 | 89.0 | 90.0 | 92.0 | 86.0 | 87.0 | 92.0 |
|  |  | Ga₂O₃ | 8.0 | 9.0 | 7.0 | 6.0 | 6.0 | 10.0 | 7.0 | 7.0 |
|  |  | Sm₂O₃ | 4.0 | 2.0 | 4.0 | 4.0 | 2.0 | 3.0 | 6.0 | 1.0 |
|  |  | ZnO | — | — | — | — | — | — | — | — |
|  | Metal Composition Ratio [at %] | In | 85.4 | 85.6 | 86.8 | 88.2 | 89.8 | 83.3 | 85.2 | 89.2 |
|  |  | Ga | 11.5 | 12.8 | 10.1 | 8.7 | 8.7 | 14.4 | 10.1 | 10.0 |
|  |  | Sm | 3.1 | 1.5 | 3.1 | 3.1 | 1.6 | 2.3 | 4.7 | 0.8 |
|  |  | Zn | — | — | — | — | — | — | — | — |
| Compact TFT Manufacture | Sputtering Film Forming Conditions of Oxide Semiconductor | Atmosphere gas | Ar + O₂ | Ar + O₂ | Ar + O₂ | Ar + O₂ | Ar + O₂ | Ar + O₂ | Ar + O₂ | Ar + O₂ |
|  |  | Backpressure [Pa] before film formation | 4 × 10⁻⁴ or less | 4 × 10⁻⁴ or less | 4 × 10⁻⁴ or less | 4 × 10⁻⁴ or less | 4 × 10⁻⁴ or less | 4 × 10⁻⁴ or less | 4 × 10⁻⁴ or less | 4 × 10⁻⁴ or less |
|  |  | Pressure [Pa] at film formation | 0.5 | 0.5 | 0.5 | 0.5 | 0.5 | 0.5 | 0.5 | 0.5 |
|  |  | Oxygen flowrate [%] at film formation | 10 | 10 | 10 | 10 | 10 | 10 | 10 | 10 |
|  |  | Water partial pressure [Pa] at film formation | — | — | — | — | — | — | — | — |
|  |  | Magnetic flux density [G] | 1000 | 1000 | 1000 | 1000 | 1000 | 1000 | 1000 | 1000 |
|  |  | Film thickness [nm] | 50 | 50 | 50 | 50 | 50 | 50 | 50 | 50 |
|  | Semiconductor Patterning | Resist | AZ1500 | AZ1500 | AZ1500 | AZ1500 | AZ1500 | AZ1500 | AZ1500 | AZ1500 |
|  |  | Semiconductor etching | oxalic acid | oxalic acid | oxalic acid | oxalic acid | oxalic acid | oxalic acid | oxalic acid | oxalic acid |
|  | Annealing | Temperature rise pattern [° C./min] | 10 | 10 | 10 | 10 | 10 | 10 | 10 | 10 |
|  |  | Highest temperature [° C.] | 350 | 350 | 350 | 350 | 350 | 350 | 350 | 350 |
|  |  | Retention time [hour] | 1 | 1 | 1 | 1 | 1 | 1 | 1 | 1 |
|  |  | Atmosphere | air | air | air | air | air | air | air | air |
|  | Etch Stopper | Etch Stopper | SiO₂ | SiO₂ | SiO₂ | SiO₂ | SiO₂ | SiO₂ | SiO₂ | SiO₂ |
|  | Patterning | Resist | AZ5214 | AZ5214 | AZ5214 | AZ5214 | AZ5214 | AZ5214 | AZ5214 | AZ5214 |
|  | Contact Hole Formation | Resist | AZ1500 | AZ1500 | AZ1500 | AZ1500 | AZ1500 | AZ1500 | AZ1500 | AZ1500 |
|  |  | Etchant | BHF | BHF | BHF | BHF | BHF | BHF | BHF | BHF |
|  | Insulating Film of Gate Annealing | Highest temperature [° C.] | 400 | 400 | 400 | 400 | 400 | 400 | 400 | 400 |
|  |  | Retention time [hour] | 1 | 1 | 1 | 1 | 1 | 1 | 1 | 1 |
|  |  | Atmosphere | in air | in air | in air | in air | in air | in air | in air | in air |
|  | Electrode Formation | Resist | AZ5214 | AZ5214 | AZ5214 | AZ5214 | AZ5214 | AZ5214 | AZ5214 | AZ5214 |
|  |  | Electrode | Ti | Ti | Ti | Ti | Ti | Ti | Ti | Ti |
|  | Final Annealing | Highest temperature [° C.] | 200 | 200 | 200 | 200 | 200 | 200 | 200 | 200 |
|  |  | Retention time [hour] | 1 | 1 | 1 | 1 | 1 | 1 | 1 | 1 |
|  |  | Atmosphere | in air | in air | in air | in air | in air | in air | in air | in air |
|  | Final Shape | L length [μm] | 6.0 | 6.0 | 6.0 | 6.0 | 6.0 | 6.0 | 6.0 | 6.0 |
|  |  | W length [μm] | 2.8 | 2.8 | 2.8 | 2.8 | 2.8 | 2.8 | 2.8 | 2.8 |
|  |  | Film thickness [nm] of gate insulating film | 100 | 100 | 100 | 100 | 100 | 100 | 100 | 100 |
|  |  | Semiconductor/drain electrode contact region length [μm] | 3.0 | 3.0 | 3.0 | 3.0 | 3.0 | 3.0 | 3.0 | 3.0 |
|  |  | Semiconductor/source electrode contact region length [μm] | 3.0 | 3.0 | 3.0 | 3.0 | 3.0 | 3.0 | 3.0 | 3.0 |

TABLE 3

|  |  |  | Comparative 8 | Comparative 9 | Comparative 10 |
|---|---|---|---|---|---|
| Oxide Sputtering Target | Charging Composition Ratio [mass %] | $In_2O_3$ | 92.0 | 91.0 | 90.0 |
|  |  | $Ga_2O_3$ | 5.0 | 6.8 | 7.0 |
|  |  | $Sm_2O_3$ | 3.0 | 2.2 | 3.0 |
|  |  | ZnO | — | — | — |
|  | Metal Composition Ratio [at %] | In | 90.4 | 88.5 | 87.6 |
|  |  | Ga | 7.3 | 9.8 | 10.1 |
|  |  | Sm | 2.3 | 1.7 | 2.3 |
|  |  | Zn | — | — | — |
| Compact TFT Manufacture | Sputtering Film Forming Conditions of Oxide Semiconductor | Atmosphere gas | Ar + O2 | Ar + O2 | Ar + O2 |
|  |  | Backpressure [Pa] before film formation | $4 \times 10^{-4}$ or less | $4 \times 10^{-4}$ or less | $4 \times 10^{-4}$ or less |
|  |  | Pressure [Pa] at film formation | 0.5 | 0.5 | 0.5 |
|  |  | Oxygen flowrate [%] at film formation | 10 | 10 | 10 |
|  |  | Water partial pressure [Pa] at film formation | — | — | — |
|  |  | Magnetic flux density [G] | 1000 | 1000 | 1000 |
|  |  | Film thickness [nm] | 50 | 50 | 50 |
|  | Semiconductor Patterning | Resist | AZ1500 | AZ1500 | AZ1500 |
|  |  | Semiconductor etching | oxalic acid | oxalic acid | oxalic acid |
|  | Annealing | Temperature rise pattern [° C./min] | 10 | 10 | 10 |
|  |  | Highest temperature [° C.] | 350 | 350 | 350 |
|  |  | Retention time [hour] | 1 | 1 | 1 |
|  |  | Atmosphere | air | air | air |
|  | Etch Stopper Patterning | Etch Stopper | SiO2 | SiO2 | SiO2 |
|  |  | Resist | AZ5214 | AZ5214 | AZ5214 |
|  | Contact Hole Formation of Gate Insulating Film | Resist | AZ1500 | AZ1500 | AZ1500 |
|  |  | Etchant | BHF | BHF | BHF |
|  | Annealing | Highest temperature [° C.] | 600 | 600 | 600 |
|  |  | Retention time [hour] | 1 | 1 | 1 |
|  |  | Atmosphere | in air | in air | in air |
|  | Electrode Formation | Electrode | Ti | Ti | Ti |
|  |  | Resist | AZ5214 | AZ5214 | AZ5214 |
|  | Final Annealing | Highest temperature [° C.] | 200 | 200 | 200 |
|  |  | Retention time [hour] | 1 | 1 | 1 |
|  |  | Atmosphere | in air | in air | in air |
|  | Final Shape | L length [μm] | 6.0 | 6.0 | 6.0 |
|  |  | W length [μm] | 2.8 | 2.8 | 2.8 |
|  |  | Film thickness [nm] of gate insulating film | 100 | 100 | 100 |
|  |  | Semiconductor/drain electrode contact region length [μm] | 3.0 | 3.0 | 3.0 |
|  |  | Semiconductor/source electrode contact region length [μm] | 3.0 | 3.0 | 3.0 |

Evaluation of Oxide Thin Film and Compact TFT

Characteristics and the like of the compact TFTs in Examples 1 to 8 and Comparatives 1 to 10 and the oxide thin films of the compact TFTs were evaluated.

An evaluation method is as shown below. Evaluation results are shown in Tables 4, 5, and 6.

(1) State after Semiconductor Patterning

A semiconductor patterning shape after photoresist stripping was observed with an optical microscope.

FIG. 11 shows an image of the semiconductor pattern after the resist stripping observed with the microscope. In the oxide thin films of Examples 1 to 3 and Comparative 4, it was confirmed that there was no residue and a desired pattern was formed. On the other hand, in the oxide thin film according to Comparative 3, a patterning residue was confirmed.

(2) State of Semiconductor Film after Production of Compact TFT (2-1) Method of Measuring Crystalline State of Cross Section of Oxide Thin Film by Cross-Sectional TEM The crystalline state of the cross section of the oxide thin film in the TFT device was measured by pretreating the oxide thin film using a focused ion beam (FIB) device, and observing the cross section of the oxide thin film after the pretreatment using a transmission electron microscope (TEM).

Specifically, first, an ion beam was inserted in a direction perpendicular to a film surface of an area where the oxide semiconductor thin film of the TFT device was patterned, using a FIB (Hitachi High-Technologies Corporation "FB2100 model") device. Test pieces with a size of 16 μm×4 μm were sampled. Then, for the sampled test pieces, two samples were extracted for a region of 3 μm from an edge of a region where the source electrode or drain electrode and the oxide thin film overlapped in the channel length direction toward a region where the source electrode or drain electrode and the oxide thin film did not overlap. Ar ion milling was performed on the two extracted samples in the channel width direction perpendicular to the channel length and the film thickness direction until a thickness of each thin piece became about 100 nm, thereby decreasing the thickness of each of the two extracted samples. If crystal grains were not observed due to ion sputter damage during FIB processing, etching was repeated with Ar ion milling ("Model 691" manufactured by Gatan) until the crystal grains were observed at an ion gun voltage of 4 keV.

The cross-sectional TEM image was observed using a transmission electron microscope (JEM-2800 model manufactured by JEOL) at an acceleration voltage of 200 kV with an observation magnification of 200,000 times (approximately 4 μm square area), the observation magnification of 500,000 times (approximately 800 nm square area), the observation magnification of 2,000,000 times (about 200 nm square area), and the observation magnification of 10,000,000 times (about 40 nm square area).

(a) Average Grain-Boundary Angle θ with Respect to Thin Film Surface

An average grain-boundary angle θ with respect to the thin film surface when observing the cross section of the oxide thin film can be calculated by analyzing the angle formed by the crystal grain boundaries observed by the cross-sectional TEM and the thin film surface. In the image observed at the observation magnification of 200,000 times, any three fields of view were extracted so that observation points did not overlap in the L length direction in the thin film transistor with a size of 1 μm in the channel direction and the oxide film thickness of 50 nm, and the cross-sectional TEM image was observed. An angle formed between the thin film surface and the crystal grain boundaries was calculated by performing image analysis on the obtained cross-sectional TEM images of the three fields of view using "SPIP, Version 4.3.2.0" manufactured by Image Metrology. Details are as follows.

With respect to the cross-sectional TEM image, lines of color code H0, S0, V10 are drawn at the crystal grain boundaries. Further, the contrast was quantified using image analysis software, and a height of (maximum concentration−minimum concentration)×¼ was set as a threshold value. Next, a region showing a contrast having a value equal to or less than the threshold value was defined as the crystal grain boundary, and the angle formed between each thin film surface and the crystal grain boundary was obtained. A total value of the obtained angles formed between the thin film surfaces and the respective crystal grain boundaries was divided by the number of grains, and an average value of the angles obtained from the three visual fields was defined as the average grain-boundary angle θ with respect to the thin film surface.

As a result, the average grain-boundary angle θ in Examples 1 to 8 and Comparatives 1, 2, 5 to 7 fell within a range of 70 degrees<θ<110 degrees.

(b) Average Grain-Boundary Angle θSub with Respect to Support

The crystal grain boundaries were extracted using the same cross-sectional TEM image and analysis method as those for the average grain-boundary angle θ with respect to the thin film surface, and the angle formed with respect to the support was obtained. A total value of the obtained angles formed between the support surfaces and the respective crystal grain boundaries was divided by the number of grains, and an average value of the angles obtained from the three visual fields was defined as the average grain-boundary angle θsub with respect to the support surface.

As a result, the average grain-boundary angle θsub in Examples 1 to 8 and Comparatives 1, 2, 5 to 7 fell within a range of 70 degrees<θsub<110 degrees.

(c) Average Interval $D_2$ Between Crystal Grain Boundaries

An average interval $D_2$ when observing the cross section of the oxide thin film can be calculated by analyzing intervals between crystal grains observed by the cross-sectional TEM. In the image observed at the observation magnification of 200,000 times, any three fields of view were extracted so that observation points did not overlap in the L length direction in the thin film transistor with a size of 1 μm in the channel direction and the oxide film thickness of 50 nm, and the cross-sectional TEM images were observed. The average interval $D_2$ of the crystal grain boundaries was calculated by performing image analysis on the obtained cross-sectional TEM images of the three fields of view using "SPIP, Version 4.3.2.0" manufactured by Image Metrology. Details are as follows.

With respect to the cross-sectional TEM images, lines of color code H0, S0, V10 are drawn at the crystal grain boundaries. Further, the contrast was quantified using image analysis software, and a height of (maximum concentration−minimum concentration)×¼ was set as a threshold value. Next, a region showing a contrast having a value equal to or less than the threshold value was defined as the crystal grain boundary, and an interval between each crystal grain boundary and the closest grain was obtained and defined as the interval of the crystal grain boundaries. A total value of the obtained intervals of the grain boundaries was divided by the number of points where the intervals were measured and the obtained value was defined as the average interval of the crystal grain boundaries, and an average value of the average intervals of the crystal grain boundaries obtained in each of the three visual fields was calculated as $D_2$.

As a result, $D_2$<0.40 μm was obtained in Examples 1 to 3, 7 and 8 and 0.40 μm<$D_2$ was obtained in Comparatives 1, 2 and 5 to 7.

(d) Method of Determining Amorphous or Crystal by Electron Diffraction

The method of determining amorphous or crystal was determined by observing an electron diffraction pattern on a sample obtained by observing a cross-sectional TEM image.

Specifically, using an electron microscope (JEM-2800 type manufactured by JEOL Ltd.), an electron beam was applied to the oxide thin film area observed by the cross-sectional TEM image with an irradiation area of about 100 nmφ and an acceleration voltage of 200 kV by selected-area aperture. A camera length was set to 2 m and a diffraction pattern was measured. An oxide thin films in which clear diffraction spots were not obtained was judged to be "amorphous" in any three fields of view extracted so that the observation points did not overlap in the L-length direction in the cross-sectional TEM image sample. On the other hand, an oxide thin film in which the diffraction points having symmetry were observed from the diffraction pattern was judged to be "crystal."

As a result, the oxide thin films of Examples 1 to 8 and Comparatives 1, 2, 3, 5 to 7 were judged to be "crystal," and the oxide thin film of Comparative 4 was judged to be "amorphous."

(2-2) Method of Measuring Crystalline State of Oxide Thin Film by Plane TEM

The crystalline state observed in a direction perpendicular to a film surface of the oxide thin film in the TFT device was measured by pretreating the film surface of the oxide thin film using a focused ion beam (FIB) device, and observing the film surface of the oxide thin film after the pretreatment using a transmission electron microscope (TEM).

Specifically, first, an ion beam was inserted in a direction parallel to a film surface of an area where the oxide semiconductor thin film of the TFT device was patterned, using a FIB (Hitachi High-Technologies Corporation "FB2100 model") device. A test piece with a size of 12 μm×4 μm was sampled. Then, three sample ranges were extracted from the sampled test piece, the sample ranges each having 2 μm Q (size of 2 μm×2 μm) in a channel direction from an edge of a region where the source electrode or drain electrode and the oxide thin film overlapped to a region where the source electrode or drain electrode and the oxide thin film did not overlap. Gallium ion beam was irradiated to the extracted three ranges until the thickness of the thin piece became approximately 100 nm, thereby decreasing the thickness of the three extracted sample ranges. The plane TEM image was observed using a transmission electron microscope ("JEM-2800 model" manufactured by JEOL Ltd.) at an acceleration voltage of 200 kV and increased in magnification until five or more crystal grains were observed.

(e) Average Crystal Grain Size $D_1$

The average crystal grain size $D_1$ when observed from the film thickness direction of the oxide thin film can be calculated by analyzing diameters of the crystal grains observed by the plane TEM observed at a magnification of 200,000 times for the three samples. The average crystal grain size $D_1$ was calculated by performing image analysis on the obtained plane TEM images using "SPIP, Version 4.3.2.0" manufactured by Image Metrology.

With respect to the plane TEM images, lines of color code H0, S0, V10 are drawn at the crystal grain boundaries. Further, the contrast was quantified using image analysis software, and a height of (maximum concentration−minimum concentration)×¼ was set as a threshold value. Next, a region showing a contrast having a value equal to or more than the threshold value was defined as crystal grains, and an area of each crystal grain was obtained. A total area of the obtained areas of the crystal grains was calculated, and the obtained total area was divided by the number of the measured crystal grains to obtain an average grain area $S_1$. Further, assuming that the crystal grains are circles, a diameter of each crystal grain was obtained by the average grain area $S_1$ and a formula (A), and this diameter was defined as the average crystal grain size of the crystal grains. An average value of the average crystal grain sizes in the three samples was calculated and defined as the final average crystal grain size $D_1$.

Numerical Formula 1

$$D_1 = 2\sqrt{\frac{S_1}{\pi}} \tag{A}$$

As a result, $D_1$<0.50 μm was obtained in Examples 1 to 8, 0.50 μm<$D_1$ was obtained in Comparatives 1, 2 and 5 to 10, and $D_1$<0.05 μm was obtained in Comparative 3.

(f) Segregation of Metal Elements (Measurement Method of Segregation of Metal Elements in Oxide Thin Films by Plane TEM-EDS)

A metal dispersion state (segregation of metal elements) of the oxide thin film was measured by observing three sample fields, which were obtained by the plane TEM observation, using the transmission electron microscope (TEM)/energy dispersive X-ray spectroscopy (EDS: Energy Dispersive X-ray Spectroscopy).

Specifically, in the oxide thin film area where the plane TEM image was observed using an electron microscope ("JEM-2800 model" manufactured by JEOL Ltd.), an observation range containing five or more crystal grains was irradiated with an electron beam at an acceleration voltage of 200 kV, and EDS mapping measurement of each element was performed. As a result, in the mapping of each of the crystal grains, when uneven distribution of each metal element was not observed between the crystal grains, it was judged as "no segregation", and when the uneven distribution was observed for each crystal grain in the mapping, it was judged as "segregation."

The presence or absence of metal uneven distribution was determined by quantifying the plane TEM-EDS mapping of each sample and each element by performing image analysis using "SPIP, Version 4.3.2.0" manufactured by Image Metrology. Specifically, first, a contrast of each mapping image is quantified and expressed as 265 pixels×265 pixels. Next, an average concentration $I_{ave}$ per pixel is calculated for the entire field of view. Next, the plane TEM image and the plane TEM-EDS mapping are compared, and for five or more crystal grains from each field of view, an area of ½ the size of each average crystal grain size $D_1$ is selected within the crystal grains. An average concentration $I_{grain}$ of the selected area is obtained. Regarding the average concentration $I_{ave}$ and the average concentration $I_{grain}$ obtained by such image analysis, a case where there were two or more areas per field of view that satisfied the relationship of $I_{ave}$<$I_{grain}$ was judged as "segregation", and a case where there were less than two areas was judged as "no segregation."

As a result, segregation was not confirmed in Examples 1 to 3 and Comparative 1. On the other hand, Comparative 2 was judged to have metal segregation by analysis of In EDS mapping, and Comparative 3 was judged to have metal segregation by analysis of Ga EDS mapping.

(2-3) Metal Composition Percentages

The oxide thin film of the obtained sample was analyzed by an inductively coupled plasma emission spectrometer (ICP-AES, manufactured by Shimadzu Corporation).

(2-4) Identification of Crystal Structure by Electron Diffraction

By observing an electron diffraction pattern of the sample obtained by observing the cross-sectional TEM image, it was evaluated whether or not the crystal structure of the oxide thin film was a Bixbyite structure. Evaluation results are shown in Tables 4, 5, and 6.

Specifically, using an electron microscope (JEM-2800 model manufactured by JEOL Ltd.), an electron beam was applied to the oxide thin film area observed by the cross-sectional TEM image with an irradiation area of about 100 nmφ and an acceleration voltage of 200 kV by selected-area aperture. A camera length was set to 2 m and a diffraction pattern was measured.

Further, in order to identify the crystal structure, the electron diffraction pattern of the Bixbyite structure of $In_2O_3$ was simulated using electron diffraction simulation software ReciPro (free software ver4.641 (2019/03/04)). In the simulation, 14388 of ICSD (Inorganic Crystal Structure Database: Japan Association for International Chemical Information) was used for crystal structure data of the Bixbyite structure, and space group: Ia-3, lattice constant: a=10.17700 Å, atomic coordinates In-site (0.250, 0.250, 0.250), In-site (0.466, 0.000, 0.250), 0-site (0.391, 0.156, 0.380) were used.

Further, with a camera length of 2 mm, simulations were performed with 11 types of reciprocal lattice vectors (1 0 0), (1 1 1), (1 1 0), (2 1 1), (3 1 1), (2 2 1), (3 3 1), (2 1 0), (3 1 0), (3 2 1), and (2 3 0) as incident electron beam directions.

The electron diffraction pattern of the oxide thin film was compared with the result of the diffraction spot for the obtained simulation pattern, and when the electron diffraction pattern of the oxide thin film was the same as any one of the 11 types of simulation patterns, it was determined that the oxide thin film contained crystal grains with a Bixbyite structure.

As a result, it was determined that the crystal structure of the oxide film in the device was a "Bixbyite" structure in Examples 1 to 8, Comparatives 1 to 3 and 5 to 7.

(3) Compact TFT Characteristics

Compact TFT characteristics were measured using a semiconductor parameter analyzer ("B1500" manufactured by Agilent) for a compact TFT device obtained in line with the final shapes in Tables 1, 2 and 3, at room temperature and in a light-shielding environment (inside a shield box). The drain voltage (Vd) of 0.1V, 10V or 20V was applied. A current value Id was measured in increments of 0.2V from −5V to 20V of the gate voltage (Vg) for each Vd application, whereby Id-Vg characteristics were obtained.

With respect to compact TFTs prepared under the production conditions shown in Table 1, 2 or 3 in Examples 1 to 8 and Comparatives 1 to 10 and showing the states of the semiconductor film shown in Tables 4, 5 and 6, Id-Vg characteristics at application of Vd=20 V are shown in FIGS. 31A to 35A and 37A and results of saturation mobility (μsat) obtained from the Id-Vg characteristics are shown in FIGS. 31B to 35B and 37B as Vg-μsat characteristics. FIG. 36 is a graph showing transfer characteristics Id-Vg about a compact TFT in Comparative 3.

Further, various parameters calculated from the Id-Vg characteristics (maximum value of linear mobility at Vg=0 to 20V, trap limiting conductivity region characteristics, S value, Vth, leak current) are shown in Tables 4, 5 and 6. A calculation method of each parameter is as described below.

(3-1)
(a) Maximum Value of Linear Mobility at Vd=0.1 V and Vg=0 to 20 V

For the maximum value of the linear mobility when Vd=0.1 V was applied, a graph of Id-Vg characteristics was created, transconductance (Gm) of each Vg was calculated, and linear mobility (μlin) was drawn using a formula of a linear region. Specifically, Gm was calculated by $\partial (Id)/\partial (Vg)$. Further, μlin was calculated by a formula (b) in the linear region.

$$\mu lin = (Gm \cdot L)/(W \cdot Ci \cdot Vd) \quad (b)$$

Ci in the formula (b) was capacitance of the gate insulating film, and a value of $Ci=3.45 \times 10^{-8}$ [F/cm$^2$] calculated based on relative permittivity of $SiO_2$ with a film thickness of 100 nm being 3.9 and permittivity of vacuum being $8.85 \times 10^{-14}$ [F/cm] was used. In the formula (b), L is the channel length (L length) and W is the channel width (W length).

Further, the maximum value of μlin at Vg=0 to 20 V was calculated from the graph of each Vg-μlin.

As a result, the maximum value of the linear mobility at Vd=0.1 V and Vg=0 to 20 V was 30 cm$^2$/(V·s) or more in Examples 1 to 8 and Comparative 7, and was less than 30 cm$^2$/(V·s) in Comparatives 1, 2, 4 to 6, and 8 to 10.

(b) Maximum Value of Saturation Mobility at Vd=10 V and Vg=0 to 10 V

For the maximum value of the saturation mobility when Vd=10 V was applied, a graph of Id-Vg characteristics was created, transconductance (Gm) of each Vg was calculated, and saturation mobility (μsat) was drawn using a formula of a saturation region. Specifically, Gm was calculated by a numerical formula (c1) below.

Numerical Formula 2

$$Gm = \partial(\sqrt{Id})/\partial(Vg) \quad (c1)$$

Further, μsat was calculated by a formula (c) of the saturation region.

$$\mu sat = (2 \cdot Gm \cdot L)/(W \cdot Ci) \quad (c)$$

In the formula (c), L is the channel length (L length) and W is the channel width (W length).

Further, the maximum value of μsat at Vg=0 to 10 V was calculated from the graph of each Vg-μsat.

(c) Maximum Value of Saturation Mobility at Vd=20 V and Vg=0 to 20 V

For the maximum value of the saturation mobility when Vd=20 V was applied, a graph of Id-Vg characteristics was created, transconductance (Gm) of each Vg was calculated, and saturation mobility (μsat) was drawn using the formula of the saturation region. Specifically, Gm was calculated by the numerical formula (c1). Further, μsat was calculated by the formula (c) of the saturation region. Furthermore, the maximum value of μsat at Vg=0 to 20 V was calculated from the graph of each Vg-μsat.

As a result, the maximum value of the saturation mobility at Vd=20 V and Vg=0 to 20 V was 25 cm$^2$/(V·s) or more in Examples 1 to 8 and Comparative 7, and was less than 25 cm$^2$/(V·s) in Comparatives 1, 2, 4 to 6, and 8 to 10.

(3-2) Trap Limiting Conductivity Region Characteristics

The trap limiting conductivity region characteristics were obtained from the graphs of Vg-μlin (Vd=0.1 V) and Vg-μsat (Vd=10 V or 20 V) obtained by the same method as in (3-1). Specifically, μlin or μsat at Vg=5 V was defined as the trap limiting conductivity region characteristics. μlin at Vd=0.1 V and μsat at Vd=10 V or 20 V were defined as the trap limiting conductivity region characteristics.

As a result, the trap limiting conductivity region characteristics at Vd=0.1 V were 16 cm$^2$/(V·s) or more in Examples 1 to 8 and less than 16 cm$^2$/(V·s) in Comparatives 1, 2, 4 to 10.

Further, the trap limiting characteristics at Vd=20 V were 23 cm$^2$/(V·s) or more in Examples 1 to 8 and less than 20 cm$^2$/(V·s) in Comparatives 1, 2 and 4 to 10.

In all Vd, the trap limiting conductivity region characteristics were higher and more favorable in Examples 1 to 8 than in Comparatives 1, 2, 4 to 10, and the compact TFT characteristics were excellent.

(3-3) S Value and Threshold Voltage (Vth)

The S value and the threshold voltage (Vth) were evaluated from each graph of Id-Vg characteristics. Specifically, in the current value $Id=10^{-11}$ to $10^{-10}$ [A] region, the value obtained by a formula (d) below was calculated as the S value. Further, a value of Vg at the current value $Id=10^{-8}$ [A] was calculated as the threshold voltage (Vth).

Numerical Formula 3

$$S = \frac{\Delta Vg}{\Delta(\log Id)} \quad (d)$$

As a result, the S value was 0.5 [V/decade] or less in Examples 1 to 8 and Comparatives 1, 2, 4 and 5.

(3-4) Leak Current

A leak current was evaluated from each graph of Id-Vg characteristics. The leak current was drawn as an average value obtained by calculating a total value of Id in the range of Vg=−5V to −2V and dividing the total value by the number of measurements.

As a result, in Examples 1 to 8 and Comparatives 1, 2, 4 to 6, and 8 to 10, the leak current was equal to or less than $1.0 \times 10^{-14}$ [A]. On the other hand, in Comparatives 3 and 7, the leakage current was equal to or more than $1.0 \times 10^{-4}$ [A], and on/off was not confirmed as a transistor.

TABLE 4

Figure 19:
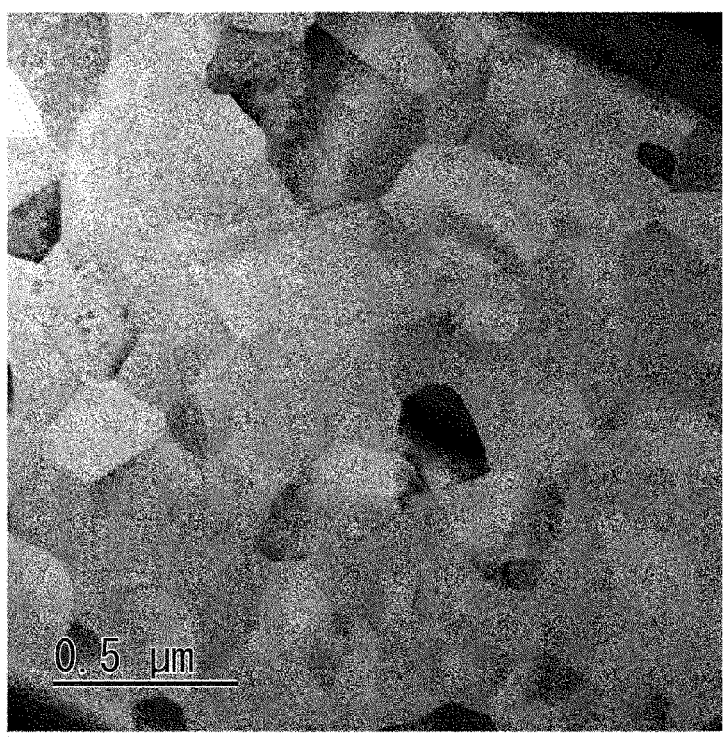
FIG. 19 is a plane TEM image of the oxide thin-film in Example 1.
Figure 20:
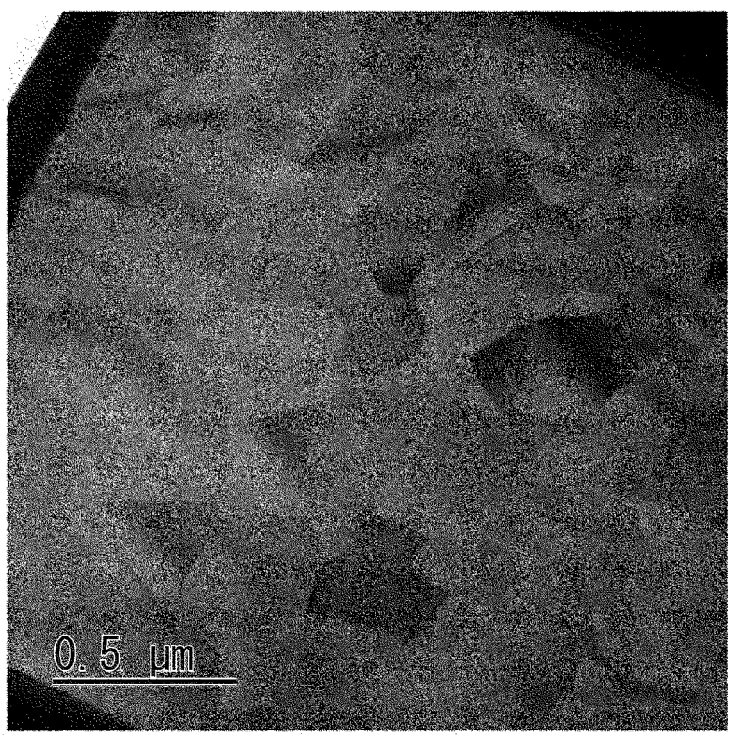
FIG. 20 is a plane TEM image of the oxide thin-film in Example 2.
Figure 21:
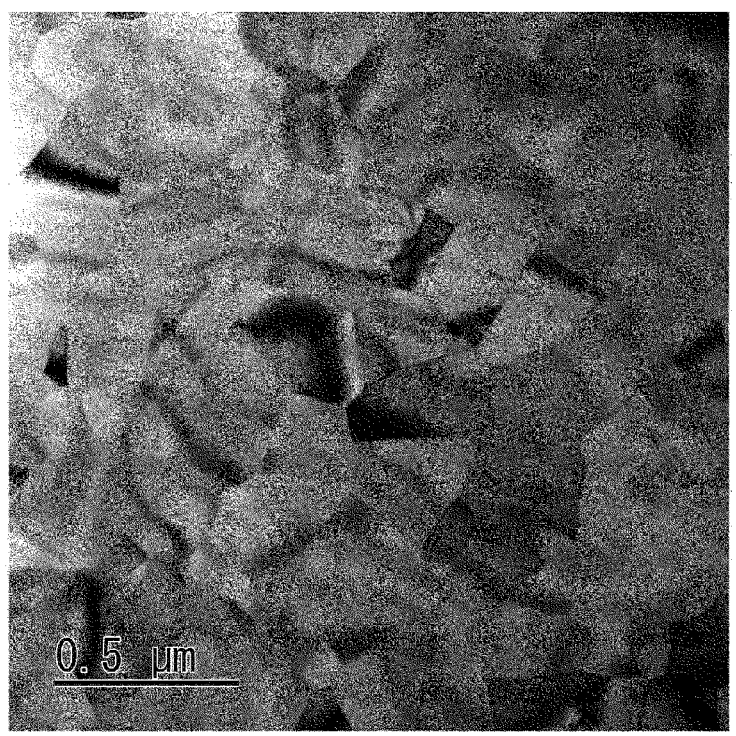
FIG. 21 is a plane TEM image of the oxide thin-film in Example 3.
Figure 22:
FIG. 22 is a plane TEM image of the oxide thin-film in Comparative 1.
Figure 23:
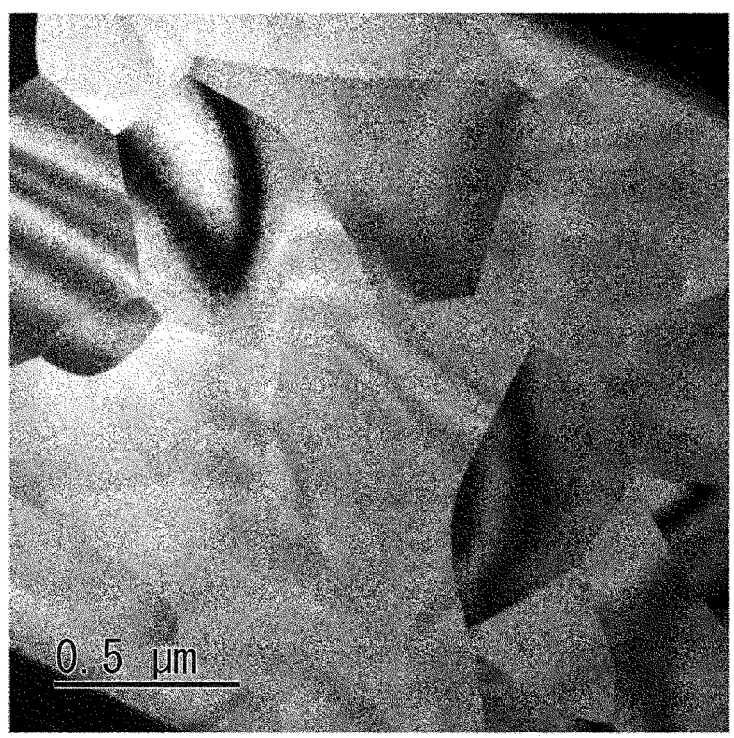
FIG. 23 is a plane TEM image of the oxide thin-film in Comparative 2.
Figure 24:
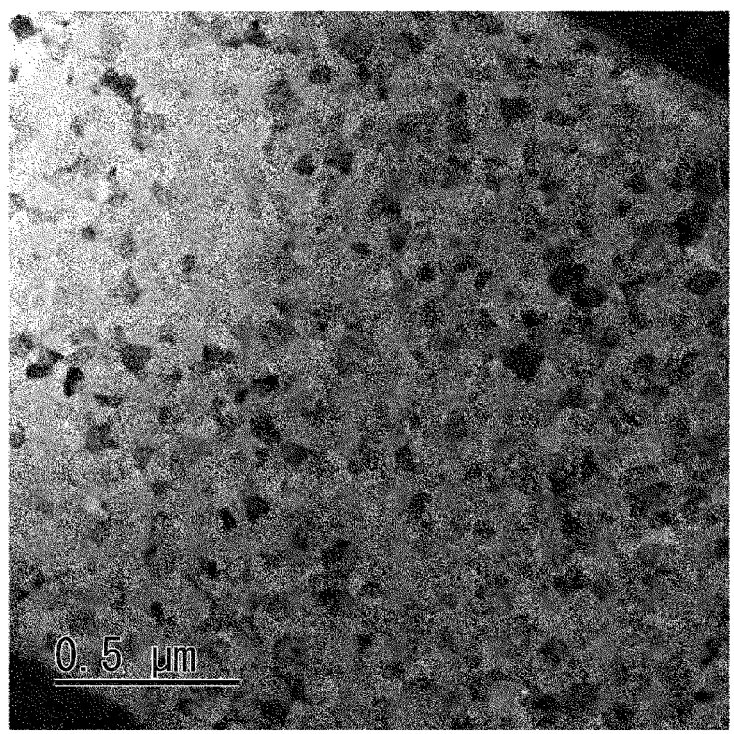
FIG. 24 is a plane TEM image of the oxide thin-film in Comparative 3.
Figure 25:
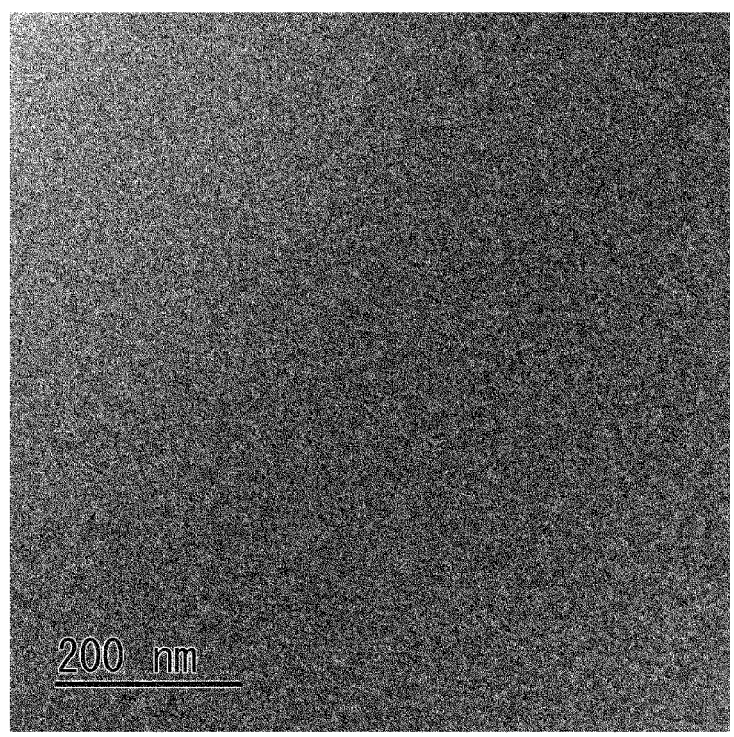
FIG. 25 is a plane TEM image of the oxide thin-film in Comparative 4.
Figure 31A:
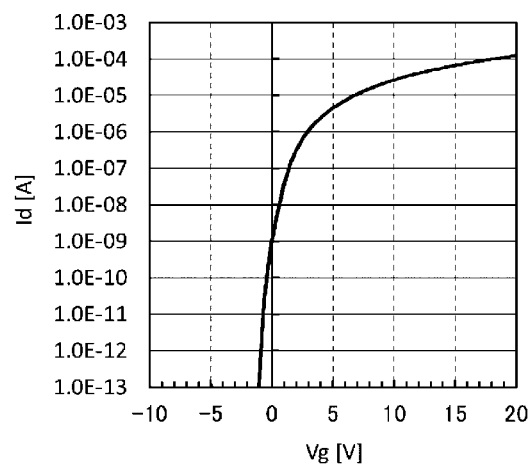
FIG. 31A is a graph showing transfer characteristics Id-Vg about a compact TFT in Example 1.
Figure 31B:
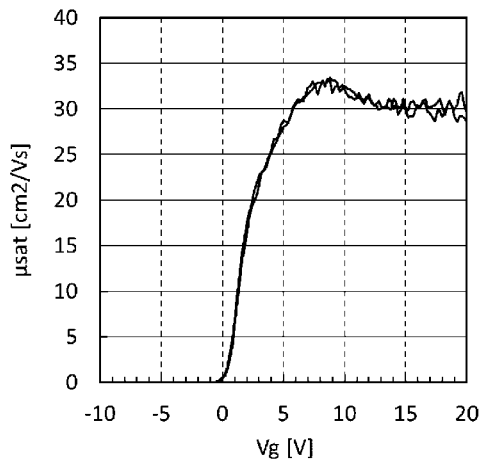
FIG. 31B is a graph showing a relationship between Vg and a mobility μsat about the compact TFT in Example 1.
Figure 32A:
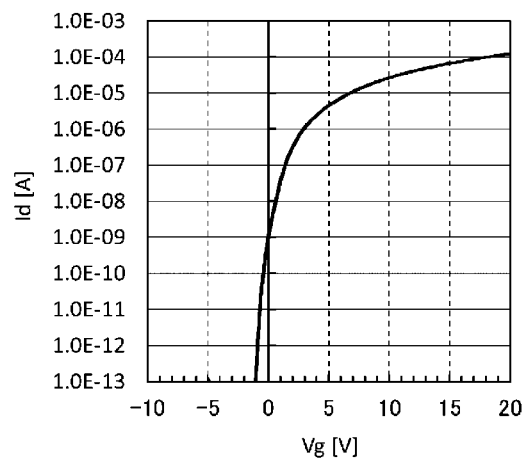
FIG. 32A is a graph showing transfer characteristics Id-Vg about a compact TFT in Example 2.
Figure 32B:
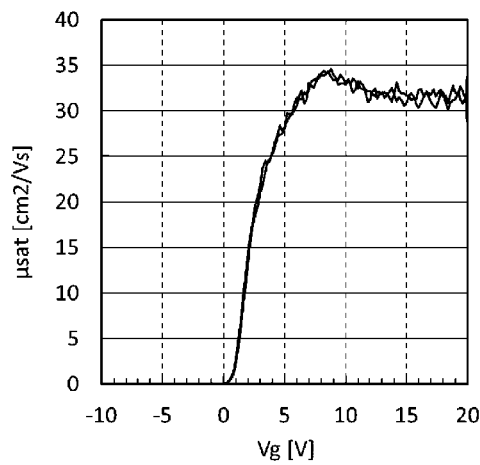
FIG. 32B is a graph showing a relationship between Vg and a mobility μsat about the compact TFT in Example 2.
Figure 33A:
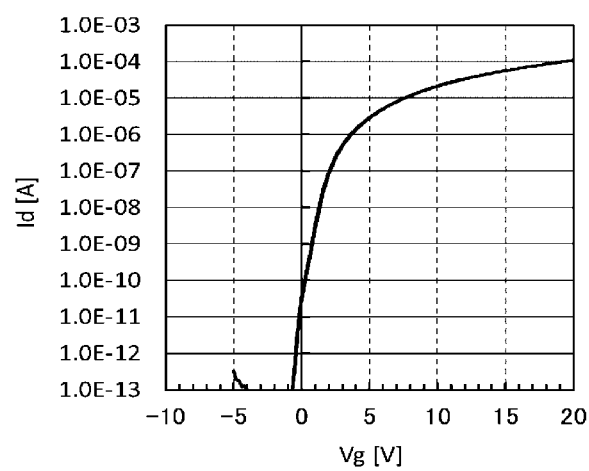
FIG. 33A is a graph showing transfer characteristics Id-Vg about a compact TFT in Example 3.
Figure 33B:
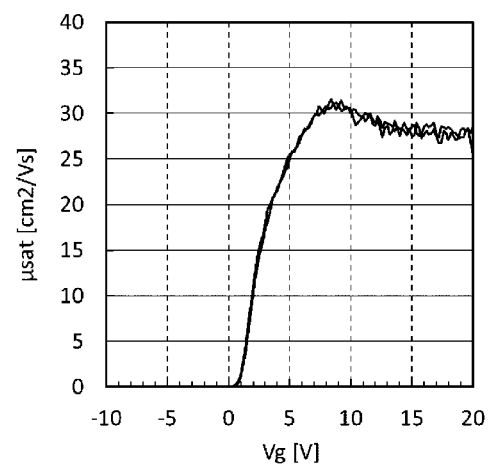
FIG. 33B is a graph showing a relationship between Vg and a mobility μsat about the compact TFT in Example 3.
Figure 34A:
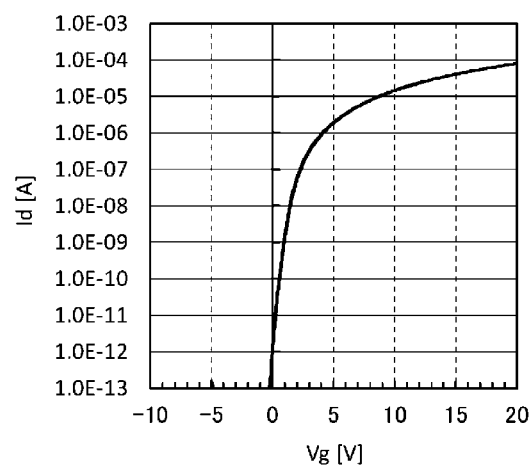
FIG. 34A is a graph showing transfer characteristics Id-Vg about a compact TFT in Comparative 1.
Figure 34B:
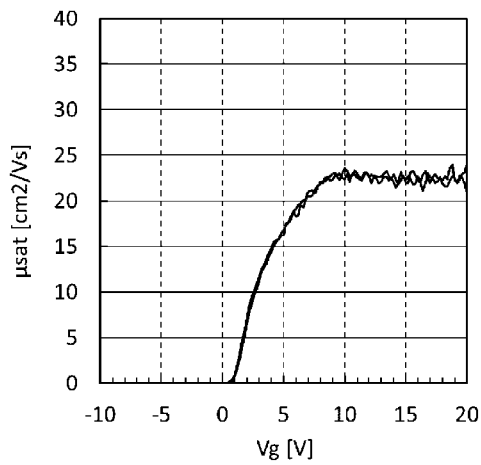
FIG. 34B is a graph showing a relationship between Vg and a mobility μsat about the compact TFT in Comparative 1.
Figure 35A:
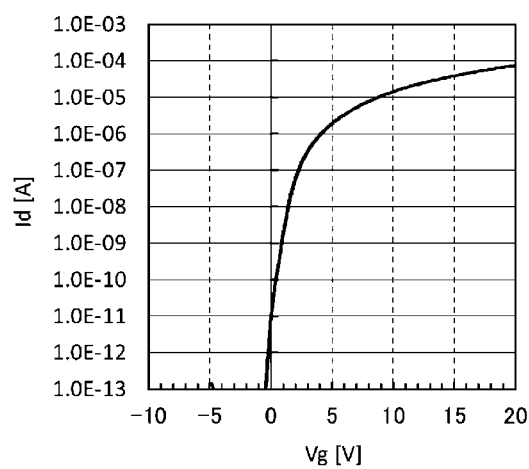
FIG. 35A is a graph showing transfer characteristics Id-Vg about a compact TFT in Comparative 2.
Figure 35B:
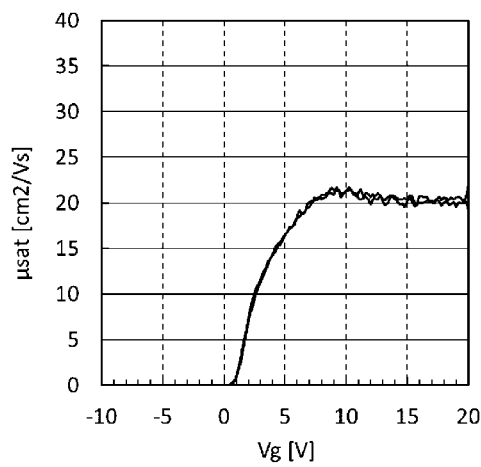
FIG. 35B is a graph showing a relationship between Vg and a mobility μsat about the compact TFT in Comparative 2.
Figure 36:
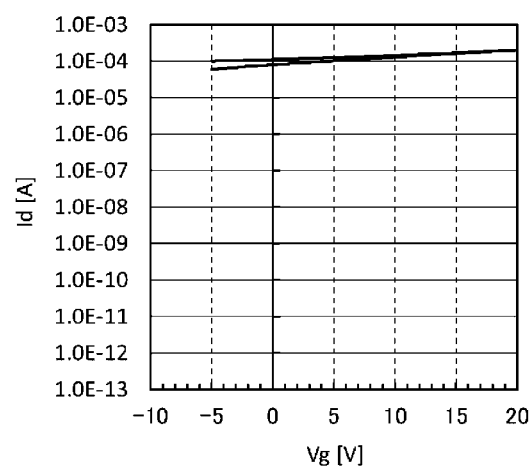
FIG. 36 is a graph showing transfer characteristics Id-Vg about a compact TFT in Comparative 3.
Figure 37A:
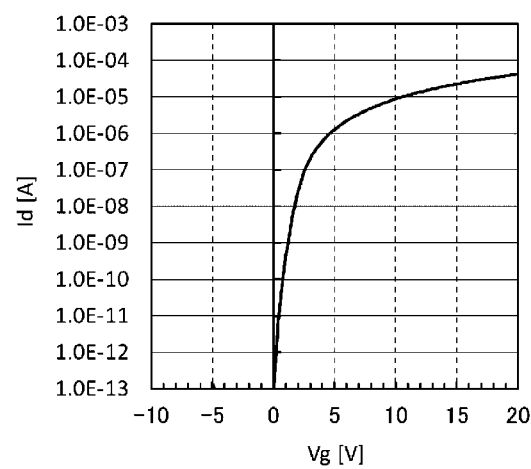
FIG. 37A is a graph showing transfer characteristics Id-Vg about a compact TFT in Comparative 4.
Figure 37B:
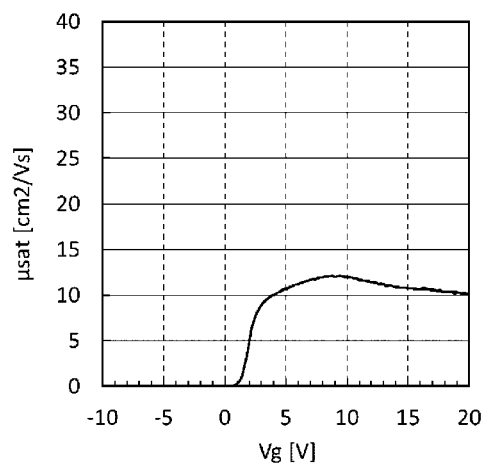
FIG. 37B is a graph showing a relationship between Vg and a mobility μsat about the compact TFT in Comparative 4.

| | | | Example 1 | Example 2 | Example 3 | Comparative 1 | Comparative 2 | Comparative 3 | Comparative 4 |
|---|---|---|---|---|---|---|---|---|---|
| Film State after Semiconductor Patterning | Observation Result of Microscope Image | Microscope image | FIG. 11 | FIG. 11 | FIG. 11 | FIG. 11 | — | FIG. 11 | FIG. 11 |
| | | Patterning residue | absent | absent | absent | absent | | present | absent |
| State of Semiconductor Film after manufacture of Compact TFT | Cross-sectional TEM | Cross-sectional TEM image | FIG. 12 | FIG. 13 | FIG. 14 | FIG. 15 | FIG. 16 | FIG. 17 | FIG. 18 |
| | | Average grain-boundary angle θ [°] to thin film surface | 94.6 | 92.4 | 103.7 | 99.0 | 98.7 | Multi-layer crystallization in film thickness direction | amorphous |
| | | Average grain-boundary angle θ sub [°] to support | 94.6 | 92.4 | 103.7 | 99.0 | 98.7 | | |
| | | Average interval $D_2$ [μm] between crystal grain boundaries | 0.11 | 0.20 | 0.22 | 0.43 | 0.43 | | |
| | | $L_s/D_2$ | 28 | 15 | 14 | 7 | 7 | | |
| | | Crystalline state | columnar crystal | columnar crystal | columnar crystal | columnar crystal | columnar crystal | | |
| | Electron Diffraction | Crystalline phase | Bixbyite | Bixbyite | Bixbyite | Bixbyite | Bixbyite | Bixbyite | |
| | Plane TEM | Plane TEM image | FIG. 19 | FIG. 20 | FIG. 21 | FIG. 22 | FIG. 23 | FIG. 24 | FIG. 25 |
| | | Average crystal grain size $D_1$ [μm] | 0.18 | 0.21 | 0.21 | 0.56 | 0.59 | 0.04 | amorphous |
| | Plane TEM-EDS | TEM-EDS image | FIG. 26 | — | FIG. 27 | FIG. 28 | FIG. 29 | FIG. 30 | |
| | | Segregation of metal element | absent | absent | absent | absent | present | present | |
| | Metal Composition Ratio [at %] | In | 90.5 | 88.5 | 87.7 | 88.8 | 87.7 | 93.0 | 36 |
| | | Ga | 7.2 | 9.8 | 9.9 | 7.2 | 9.9 | 7.0 | 35 |
| | | Sm | 2.3 | 1.7 | 2.4 | 4.0 | 2.4 | 0.0 | — |
| | | Zn | — | — | — | — | — | — | 29 |
| Compact TFT Characteristics | Vd = 0.1 V | Maximum Value [cm²/(V·s)] of Linear Mobility at Vg = 0 to 20 V | 39.5 | 40.3 | 38.0 | 29.8 | 28.0 | conductive film | 13 |
| | | Trap limiting conductivity region characteristics [cm²/(V·s)] | 20 | 20 | 19 | 12 | 13 | | 10 |
| | | S value [V/decade] | 0.41 | 0.37 | 0.40 | 0.36 | 0.46 | | 0.25 |
| | | Vth[V] | 1.6 | 2.0 | 2.2 | 2.4 | 2.3 | | 2.6 |
| | | Leak current [A] | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | | $1.0 \times 10^{-14}$ or less |
| | Vd = 10 V | Maximum Value [cm²/(V·s)] of saturation mobility at Vg = 0 to 10 V | 22.0 | 21.8 | 20.4 | 16.3 | 16.1 | | 12 |
| | | Trap limiting conductivity region characteristics [cm²/(V·s)] | 20 | 20 | 19 | 14 | 14 | | 10 |
| | | S value [V/decade] | 0.24 | 0.25 | 0.30 | 0.31 | 0.36 | | 0.34 |
| | | Vth[V] | 1.2 | 0.7 | 1.4 | 1.5 | 1.5 | | 1.6 |
| | | Leak current [A] | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | | $1.0 \times 10^{-14}$ or less |
| | Vd = 20 V | Id-Vg characteristics | FIGS. 31A, 31B | FIGS. 32A, 32B | FIGS. 33A, 33B | FIGS. 34A, 34B | FIGS. 35A, 35B | FIG. 36 conductive film | FIGS. 37A, 37B |
| | | Maximum Value [cm²/(V·s)] of saturation mobility at Vg = 0 to 20 V | 33.3 | 34.3 | 31.6 | 22.7 | 21.7 | | 12 |
| | | Trap limiting conductivity region characteristics [cm²/(V·s)] | 29 | 28 | 26 | 16 | 15 | | 11 |
| | | S value [V/decade] | 0.27 | 0.33 | 0.40 | 0.30 | 0.45 | | 0.32 |
| | | Vth[V] | 0.7 | 1.2 | 1.4 | 1.5 | 1.4 | | 1.8 |
| | | Leak current [A] | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | | $1.0 \times 10^{-14}$ or less |

TABLE 5

| | | | Example 4 | Example 5 | Example 6 | Example 7 | Example 8 | Comparative 5 | Comparative 6 | Comparative 7 |
|---|---|---|---|---|---|---|---|---|---|---|
| Film State after Semiconductor Patterning | Observation Result of Microscope Image | Microscope image | — | — | — | — | — | — | — | — |
| | | Patterning residue | absent | absent | absent | absent | absent | absent | absent | absent |
| State of Semiconductor | Cross-sectional TEM | Average grain-boundary angle θ [°] to thin film surface | 95.2 | 96.9 | 89.1 | 90.1 | 92.5 | 100.2 | 102.5 | 99.9 |

TABLE 5-continued

| | | | Example 4 | Example 5 | Example 6 | Example 7 | Example 8 | Comparative 5 | Comparative 6 | Comparative 7 |
|---|---|---|---|---|---|---|---|---|---|---|
| Film after manufacture of Compact TFT | | Average grain-boundary angle θ sub [°] to support | 95.2 | 96.9 | 89.1 | 90.1 | 92.5 | 100.2 | 102.5 | 99.9 |
| | | Average interval $D_2$ [μm] between crystal grain boundaries | — | — | — | 0.15 | 0.21 | 0.75 | 0.70 | 0.60 |
| | | $L_s/D_2$ | — | — | — | 20 | 14 | 4 | 4 | 5 |
| | | Crystalline state | columnar crystal | columnar crystal | columnar crystal | columnar crystal | columnar crystal | columnar crystal | columnar crystal | columnar crystal |
| | Electron Diffraction | Crystalline phase | Bixbyite | Bixbyite | Bixbyite | Bixbyite | Bixbyite | Bixbyite | Bixbyite | Bixbyite |
| | Plane TEM | Average crystal grain size $D_1$ [μm] | 0.45 | 0.42 | 0.44 | 0.18 | 0.24 | 0.79 | 0.83 | 0.61 |
| Compact TFT Characteristics | Vd = 0.1 V | Maximum Value [cm²/(V·s)] of Linear Mobility at Vg = 0 to 20 V | 34.2 | 35.1 | 33.2 | 38.5 | 36.2 | 25.2 | 21.5 | 35.1 |
| | | Trap limiting conductivity region characteristics [cm²/(V·s)] | 17.7 | 18.3 | 17.1 | 18.5 | 16.2 | 11.3 | 9.9 | 15.7 |
| | | S value [V/decade] | 0.32 | 0.35 | 0.31 | 0.37 | 0.32 | 0.42 | 0.57 | 0.80 |
| | | Vth[V] | 1.58 | 1.32 | 2.21 | 1.11 | 1.31 | 2.81 | 3.10 | −8.00 |
| | | Leak current [A] | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-12}$ |
| | Vd = 10 V | Maximum Value [cm²/(V·s)] of saturation mobility at Vg = 0 to 10 V | 19.5 | 20.0 | 19.4 | 22.3 | 19.5 | 13.6 | 11.1 | 19.3 |
| | | Trap limiting conductivity region characteristics [cm²/(V·s)] | 17.9 | 18.6 | 17.5 | 20.1 | 18.2 | 12.7 | 10.7 | 17.2 |
| | | S value [V/decade] | 0.25 | 0.28 | 0.22 | 0.30 | 0.29 | 0.40 | 0.52 | 0.92 |
| | | Vth[V] | 1.31 | 1.02 | 1.99 | 0.35 | 1.08 | 2.72 | 2.70 | −12.00 |
| | | Leak current [A] | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-11}$ |
| | Vd = 20 V | Maximum Value [cm²/(V·s)] of saturation mobility at Vg = 0 to 20 V | 28.7 | 29.8 | 29.2 | 34.3 | 30.4 | 20.4 | 17.8 | 28.8 |
| | | Trap limiting conductivity region characteristics [cm²/(V·s)] | 23.8 | 23.6 | 23.7 | 27.4 | 24.6 | 14.5 | 11.2 | 19.9 |
| | | S value [V/decade] | 0.22 | 0.25 | 0.20 | 0.29 | 0.28 | 0.40 | 0.53 | 0.85 |
| | | Vth[V] | 1.30 | 1.02 | 1.95 | 0.32 | 1.04 | 0.39 | 2.81 | −14.50 |
| | | Leak current [A] | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $1.0 \times 10^{-14}$ or less | $5.0 \times 10^{-11}$ or less |

TABLE 6

| | | | Comparative 8 | Comparative 9 | Comparative 10 |
|---|---|---|---|---|---|
| Film State after Semiconductor Patterning | Observation Result of Microscope Image | Microscope image | — | — | — |
| | | Patterning residue | — | — | — |
| State of Semiconductor Film after manufacture of Compact TFT | Cross-sectional TEM | Average grain-boundary angle θ [°] to thin film surface | — | — | — |
| | | Average grain-boundary angle θ sub [°] to support | — | — | — |
| | | Average interval $D_2$ [μm] between crystal gram boundaries | — | — | — |
| | | $L_s/D_2$ | — | — | — |
| | | Crystalline state | — | — | — |
| | Electron Diffraction | Crystalline phase | Bixbyite | Bixbyite | Bixbyite |
| | Plane TEM | Average crystal gram size $D_1$[μm] | 2.94 | 2.34 | 1.90 |
| Compact TFT Characteristics | Vd = 0.1 V | Maximum Value [cm²/(V·s)] of Linear Mobility at Vg = 0 to 20 V | 13.1 | 11.3 | 10.3 |
| | | Trap limiting conductivity region charactenstics [cm²/(V·s)] | 5.5 | 4.8 | 3.2 |
| | | S value [V/decade] | 1.44 | 1.49 | 1.67 |
| | | Vth[V] | 2.68 | 2.72 | 2.90 |
| | | Leak current [A] | $1.0 \times 10^{-14}$ or less | $10. \times 10^{-14}$ or less | $1.0 \times 10^{-14}$ or less |

TABLE 6-continued

|  |  | Comparative 8 | Comparative 9 | Comparative 10 |
|---|---|---|---|---|
| Vd = 10 V | Maximum Value [cm$^2$/(V·s)] of saturation mobility at Vg = 0 to 10 V | 6.9 | 6.6 | 5.2 |
|  | Trap limiting conductivity region characteristics [cm$^2$/(V·s)] | 6 | 5.9 | 4.3 |
|  | S value [V/decade] | 1.37 | 1.40 | 1.58 |
|  | Vth[V] | 2.48 | 2.50 | 2.85 |
|  | Leak current [A] | $1.0 \times 10^{-14}$ or less | $1.0 \times 10^{-14}$ or less | $1.0 \times 10^{-14}$ or less |
| Vd = 20 V | Maximum Value [cm$^2$/(V·s)] of saturation mobility at Vg = 0 to 20 V | 7.1 | 7.7 | 8.6 |
|  | Trap limiting conductivity region characteristics [cm$^2$/(V·s)] | 6.4 | 6.7 | 7.9 |
|  | S value [V/decade] | 1.41 | 1.62 | 1.55 |
|  | Vth [V] | 1.99 | 2.05 | 2.21 |
|  | Leak current [A] | $1.0 \times 10^{-14}$ or less | $1.0 \times 10^{-14}$ or less | $1.0 \times 10^{-14}$ or less |

In the crystalline oxide thin films of Examples 1 to 8, the average crystal grain size was 0.5 μm or less, and as compared with the oxide thin films of Comparatives 1, 2, and 5 to 10 having the average crystal grain size exceeding 0.5 μm, the trap limiting conductivity region characteristics at the drain voltages (Vd) of 0.1 V, 10 V and 20 V were excellent.

In the crystalline oxide thin films of Examples 1 to 8, the samarium element was used as the Ln element. However, it is considered that, with having an ionic radius about the same as that of the samarium element, the elements of the Ln element other than the samarium element produce the same effects as the crystalline oxide thin film containing the samarium element as the Ln element.

The invention claimed is:

1. A crystalline oxide thin film comprising: an In element, a Ga element, and a Ln element, wherein
   the In element is a main component,
   the Ln element is at least one element selected from the group consisting of La, Nd, Sm, Eu, Gd, Tb, Dy, Ho, Er, Tm, Yb, and Lu, and
   the crystalline oxide thin film comprises an average crystal grain size $D_1$ in a range from 0.05 μm to 0.5 μm, wherein
   an average grain-boundary angle θ formed between a thin film surface of the crystalline oxide thin film and crystal grain boundaries inside the crystalline oxide thin film is in a range from 70 degrees to 110 degrees.

2. The crystalline oxide thin film according to claim 1, wherein
   an average interval $D_2$ between crystal grain boundaries inside the crystalline oxide thin film is in a range from 0.05 μm to 0.40 μm.

3. The crystalline oxide thin film according to claim 1, wherein
   in a plane TEM-EDS analysis on the crystalline oxide thin film, metal elements forming the crystalline oxide thin film are not segregated in the crystal grain boundaries inside the crystalline oxide thin film.

4. The crystalline oxide thin film according to claim 1, wherein
   ranges of atomic composition ratios represented by formulae (1), (2) and (3) are satisfied, $$0.85 < \text{In}/(\text{In}+\text{Ga}+\text{Ln}) \leq 0.98 \quad (1)$$

$$0.01 \leq \text{Ga}/(\text{In}+\text{Ga}+\text{Ln}) < 0.11 \quad (2)$$

$$0.01 \leq \text{Ln}/(\text{In}+\text{Ga}+\text{Ln}) < 0.04 \quad (3).$$

5. The crystalline oxide thin film according to claim 1, wherein
   the crystalline oxide thin film comprises crystal grains with a Bixbyite structure in electron beam diffraction of the crystalline oxide thin film.

6. The crystalline oxide thin film according to claim 1, wherein the Ln element is a Sm element.

7. A thin film transistor comprising: electrodes; and a crystalline oxide thin film, wherein
   the crystalline oxide thin film comprises an In element, a Ga element and a Ln element,
   the In element is a main component of the crystalline oxide thin film,
   the Ln element is at least one element selected from the group consisting of La, Nd, Sm, Eu, Gd, Tb, Dy, Ho, Er, Tm, Yb, and Lu,
   the electrodes comprise a source electrode, a drain electrode, and a gate electrode; and
   in a cross-sectional TEM observation of the thin film transistor, a contact region length Ls between (a) the source electrode or the drain electrode and (b) the crystalline oxide thin film and an average interval $D_2$ between crystal grain boundaries inside the crystalline oxide thin film satisfy relationships of a formula (4) and a formula (5), $$1 \text{ μm} \leq Ls \leq 50 \text{ μm} \quad (4)$$

$$10 \leq Ls/D_2 \leq 1000 \quad (5).$$

8. The thin film transistor according to claim 7, wherein
   an average crystal grain size $D_1$ in the crystalline oxide thin film is in a range from 0.05 μm to 0.5 μm.

9. The thin film transistor according to claim 7, wherein
   an average grain-boundary angle θ formed between a thin film surface of the crystalline oxide thin film and the crystal grain boundaries inside the crystalline oxide thin film is in a range from 70 degrees to 110 degrees, and
   an average interval $D_2$ between the crystal grain boundaries inside the crystalline oxide thin film is in a range from 0.05 μm to 0.40 μm.

10. A thin film transistor comprising: a crystalline oxide thin film, wherein
    the crystalline oxide thin film comprises an In element, a Ga element, and a Ln element,
    the In element is a main component,
    the Ln element is at least one element selected from the group consisting of La, Nd, Sm, Eu, Gd, Tb, Dy, Ho, Er, Tm, Yb, and Lu, an average crystal grain size $D_1$ in the crystalline oxide thin film is in a range from 0.05 μm to 0.5 μm, an average grain-boundary angle θ formed between a thin film surface of the crystalline oxide thin film and crystal grain boundaries inside the crystalline oxide thin film is in a range from 70 degrees to 110 degrees, and an average interval $D_2$ between the crystal grain boundaries inside the crystalline oxide thin film is in a range from 0.05 μm to 0.40 μm.

11. The thin film transistor according to claim 10, wherein in a plane TEM-EDS analysis on the crystalline oxide thin film, metal elements forming the crystalline oxide thin film are not segregated in the crystal grain boundaries inside the crystalline oxide thin film.

12. The thin film transistor according to claim 10, wherein ranges of atomic composition ratios represented by formulae (1), (2) and (3) are satisfied, $$0.85 < \text{In}/(\text{In}+\text{Ga}+\text{Ln}) \leq 0.98 \quad (1)$$

$$0.01 \leq \text{Ga}/(\text{In}+\text{Ga}+\text{Ln}) < 0.11 \quad (2)$$

$$0.01 \leq \text{Ln}/(\text{In}+\text{Ga}+\text{Ln}) < 0.04 \quad (3).$$

13. The thin film transistor according to claim 10, wherein the crystalline oxide thin film comprises crystal grains with a Bixbyite structure in electron beam diffraction.

14. The thin film transistor according to claim 10, wherein the Ln element is a Sm element.

15. A crystalline oxide thin film comprising: an In element, a Ga element, and a Ln element, wherein the In element is a main component, the Ln element is at least one element selected from the group consisting of La, Nd, Sm, Eu, Gd, Tb, Dy, Ho, Er, Tm, Yb, and Lu, and the crystalline oxide thin film comprises an average crystal grain size $D_1$ in a range from 0.05 μm to 0.5 μm, wherein an average interval $D_2$ between crystal grain boundaries inside the crystalline oxide thin film is in a range from 0.05 μm to 0.40 μm.

16. The crystalline oxide thin film according to claim 15, wherein in a plane TEM-EDS analysis on the crystalline oxide thin film, metal elements forming the crystalline oxide thin film are not segregated in the crystal grain boundaries inside the crystalline oxide thin film.

17. The crystalline oxide thin film according to claim 15, wherein ranges of atomic composition ratios represented by formulae (1), (2) and (3) are satisfied, $$0.85 < \text{In}/(\text{In}+\text{Ga}+\text{Ln}) \leq 0.98 \quad (1)$$

$$0.01 \leq \text{Ga}/(\text{In}+\text{Ga}+\text{Ln}) < 0.11 \quad (2)$$

$$0.01 \leq \text{Ln}/(\text{In}+\text{Ga}+\text{Ln}) < 0.04 \quad (3).$$

18. The crystalline oxide thin film according to claim 15, wherein the crystalline oxide thin film comprises crystal grains with a Bixbyite structure in electron beam diffraction of the crystalline oxide thin film.

19. The crystalline oxide thin film according to claim 15, wherein the Ln element is a Sm element.

20. A laminate comprising:

the crystalline oxide thin film according to claim 15; and a support supporting the crystalline oxide thin film, wherein an average grain-boundary angle θsub formed between a surface of the support and crystal grain boundaries inside the crystalline oxide thin film is in a range from 70 degrees to 110 degrees.

* * * * *